United States Patent
Wang

(10) Patent No.: US 10,164,664 B2
(45) Date of Patent: Dec. 25, 2018

(54) TIME AND CELL DE-INTERLEAVING CIRCUIT AND METHOD FOR PERFORMING TIME AND CELL DE-INTERLEAVING

(71) Applicant: MStar Semiconductor, Inc., Hsinchu Hsien (TW)

(72) Inventor: Chun-Chieh Wang, Zhubei (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 41 days.

(21) Appl. No.: 15/202,954

(22) Filed: Jul. 6, 2016

(65) Prior Publication Data

US 2017/0012737 A1 Jan. 12, 2017

(30) Foreign Application Priority Data

Jul. 7, 2015 (TW) .............................. 104122018 A

(51) Int. Cl.
| | |
|---|---|
| *H03M 13/00* | (2006.01) |
| *H03M 13/27* | (2006.01) |
| *H04L 1/00* | (2006.01) |
| *H03M 13/15* | (2006.01) |

(Continued)

(52) U.S. Cl.
CPC ..... *H03M 13/6552* (2013.01); *H03M 13/276* (2013.01); *H03M 13/2757* (2013.01); *H03M 13/2778* (2013.01); *H03M 13/6561* (2013.01); *H04L 1/0045* (2013.01); *H04L 1/0071* (2013.01); *H03M 13/1165* (2013.01); *H03M 13/152* (2013.01); *H03M 13/2906* (2013.01); *H04L 1/0057* (2013.01)

(58) Field of Classification Search
CPC ......... H03M 13/6552; H03M 13/6561; H03M 13/2778; H03M 13/276; H03M 13/2757; H03M 13/1165; H03M 13/2906; H03M 13/152; H04L 1/0071; H04L 1/0045; H04L 1/0057
See application file for complete search history.

(56) References Cited

U.S. PATENT DOCUMENTS

2003/0014700 A1* 1/2003 Giulietti .............. H03M 13/271
714/701
2008/0082762 A1* 4/2008 Taeuber .............. G06F 13/4239
711/154

(Continued)

*Primary Examiner* — Thien Nguyen
(74) *Attorney, Agent, or Firm* — WPAT, PC

(57) ABSTRACT

A method for performing time and cell de-interleaving on an interleaved signal including a plurality of cells is provided. The method includes: providing a first memory for storing the cells, the first memory written and read each time in a unit of one cell group, the cell group including K cells, where K is a positive integer greater than 1; providing a second memory for storing the cells read from the first memory; reading the cells from the first memory, and writing the cells to the second memory according to a writing rule of a plurality of permutation rules, K consecutive cells written to the second memory being from the same cell group; and reading the cells from the second memory according to a reading rule of the permutation rules, to cause the cells read from the second memory to be complete with time de-interleaving and cell de-interleaving.

20 Claims, 27 Drawing Sheets

(51) Int. Cl.
*H03M 13/11* (2006.01)
*H03M 13/29* (2006.01)

(56) References Cited

U.S. PATENT DOCUMENTS

| | | | |
|---|---|---|---|
| 2010/0118800 A1* | 5/2010 | Kim | H04L 1/0071 370/329 |
| 2015/0039973 A1* | 2/2015 | Jeong | H03M 13/11 714/776 |
| 2015/0200747 A1* | 7/2015 | Petrov | H03M 13/19 714/776 |

* cited by examiner

| | | | Nr = 8 | | | | |
|---|---|---|---|---|---|---|---|
| 0 | 20 | 40 | 60 | 80 | 100 | 120 | 140 |
| 1 | 21 | 41 | 61 | 81 | 101 | 121 | 141 |
| 2 | 22 | 42 | 62 | 82 | 102 | 122 | 142 |
| 3 | 23 | 43 | 63 | 83 | 103 | 123 | 143 |
| 4 | 24 | 44 | 64 | 84 | 104 | 124 | 144 |
| 5 | 25 | 45 | 65 | 85 | 105 | 125 | 145 |
| 6 | 26 | 46 | 66 | 86 | 106 | 126 | 146 |
| 7 | 27 | 47 | 67 | 87 | 107 | 127 | 147 |
| 8 | 28 | 48 | 68 | 88 | 108 | 128 | 148 |
| 9 | 29 | 49 | 69 | 89 | 109 | 129 | 149 |
| 10 | 30 | 50 | 70 | 90 | 110 | 130 | 150 |
| 11 | 31 | 51 | 71 | 91 | 111 | 131 | 151 |
| 12 | 32 | 52 | 72 | 92 | 112 | 132 | 152 |
| 13 | 33 | 53 | 73 | 93 | 113 | 133 | 153 |
| 14 | 34 | 54 | 74 | 94 | 114 | 134 | 154 |
| 15 | 35 | 55 | 75 | 95 | 115 | 135 | 155 |
| 16 | 36 | 56 | 76 | 96 | 116 | 136 | 156 |
| 17 | 37 | 57 | 77 | 97 | 117 | 137 | 157 |
| 18 | 38 | 58 | 78 | 98 | 118 | 138 | 158 |
| 19 | 39 | 59 | 79 | 99 | 119 | 139 | 159 |

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |
| 88 | 89 | 90 | 91 | 92 | 93 | 94 | 95 |
| 96 | 97 | 98 | 99 | 100 | 101 | 102 | 103 |
| 104 | 105 | 106 | 107 | 108 | 109 | 110 | 111 |
| 112 | 113 | 114 | 115 | 116 | 117 | 118 | 119 |
| 120 | 121 | 122 | 123 | 124 | 125 | 126 | 127 |
| 128 | 129 | 130 | 131 | 132 | 133 | 134 | 135 |
| 136 | 137 | 138 | 139 | 140 | 141 | 142 | 143 |
| 144 | 145 | 146 | 147 | 148 | 149 | 150 | 151 |
| 152 | 153 | 154 | 155 | 156 | 157 | 158 | 159 |

CDI buffer:

| 0 | 1 | 2 | 3 |
|---|---|---|---|
| 4 | 5 | 6 | 7 |
| 8 | 9 | 10 | 11 |
| 12 | 13 | 14 | 15 |
| 16 | 17 | 18 | 19 |
| 20 | 21 | 22 | 23 |
| 24 | 25 | 26 | 27 |
| 28 | 29 | 30 | 31 |
| 32 | 33 | 34 | 35 |
| 36 | 37 | 38 | 39 | permutation rule:

| 0 | 32 | 1 | 8 |
|---|----|---|---|
| 36 | 18 | 20 | 13 |
| 38 | 19 | 28 | 31 |
| 7 | 35 | 17 | 12 |
| 27 | 14 | 11 | 10 |
| 37 | 2 | 33 | 16 |
| 4 | 9 | 26 | 6 |
| 25 | 30 | 15 | 39 |
| 3 | 24 | 22 | 29 |
| 23 | 21 | 5 | 34 |

CDI output:

| 0 | 32 | 1 | 8 |
|---|----|---|---|
| 36 | 18 | 20 | 13 |
| 38 | 19 | 28 | 31 |
| 7 | 35 | 17 | 12 |
| 27 | 14 | 11 | 10 |
| 37 | 2 | 33 | 16 |
| 4 | 9 | 26 | 6 |
| 25 | 30 | 15 | 39 |
| 3 | 24 | 22 | 29 |
| 23 | 21 | 5 | 34 |

Nr=8

| 0 | | 1 | | 2 | | 3 | | 4 | | 5 | | 6 | | 7 | |
|---|---|---|---|---|---|---|---|---|---|---|---|---|---|---|---|
| 8 | 0 | 9 | 5 | 10 | 10 | 11 | 15 | 12 | 20 | 13 | 25 | 14 | 30 | 15 | 35 |
| 16 | | 17 | | 18 | | 19 | | 20 | | 21 | | 22 | | 23 | |
| 24 | | 25 | | 26 | | 27 | | 28 | | 29 | | 30 | | 31 | |
| 32 | | 33 | | 34 | | 35 | | 36 | | 37 | | 38 | | 39 | |
| 40 | 1 | 41 | 6 | 42 | 11 | 43 | 16 | 44 | 21 | 45 | 26 | 46 | 31 | 47 | 36 |
| 48 | | 49 | | 50 | | 51 | | 52 | | 53 | | 54 | | 55 | |
| 56 | | 57 | | 58 | | 59 | | 60 | | 61 | | 62 | | 63 | |
| 64 | | 65 | | 66 | | 67 | | 68 | | 69 | | 70 | | 71 | |
| 72 | 2 | 73 | 7 | 74 | 12 | 75 | 17 | 76 | 22 | 77 | 27 | 78 | 32 | 79 | 37 |
| 80 | | 81 | | 82 | | 83 | | 84 | | 85 | | 86 | | 87 | |
| 88 | | 89 | | 90 | | 91 | | 92 | | 93 | | 94 | | 95 | |
| 96 | | 97 | | 98 | | 99 | | 100 | | 101 | | 102 | | 103 | |
| 104 | 3 | 105 | 8 | 106 | 13 | 107 | 18 | 108 | 23 | 109 | 28 | 110 | 33 | 111 | 38 |
| 112 | | 113 | | 114 | | 115 | | 116 | | 117 | | 118 | | 119 | |
| 120 | | 121 | | 122 | | 123 | | 124 | | 125 | | 126 | | 127 | |
| 128 | | 129 | | 130 | | 131 | | 132 | | 133 | | 134 | | 135 | |
| 136 | 4 | 137 | 9 | 138 | 14 | 139 | 19 | 140 | 24 | 141 | 29 | 142 | 34 | 143 | 39 |
| 144 | | 145 | | 146 | | 147 | | 148 | | 149 | | 150 | | 151 | |
| 152 | | 153 | | 154 | | 155 | | 156 | | 157 | | 158 | | 159 | |

| 0 | 8 | 16 | 24 | 32 | 40 | 48 | 56 | 64 | 72 |
|---|---|---|---|---|---|---|---|---|---|
| 0 | | 8 | | 16 | 24 | 32 | | 40 | |
| 1 | 9 | 17 | 25 | 33 | 41 | 49 | 57 | 65 | 73 |
| 1 | | 9 | | 17 | 25 | 33 | | 41 | |
| 2 | 10 | 18 | 26 | 34 | 42 | 50 | 58 | 66 | 74 |
| 2 | | 10 | | 18 | 26 | 34 | | 42 | |
| 3 | 11 | 19 | 27 | 35 | 43 | 51 | 59 | 67 | 75 |
| 3 | | 11 | | 19 | 27 | 35 | | 43 | |
| 4 | 12 | 20 | 28 | 36 | 44 | 52 | 60 | 68 | 76 |
| 4 | | 12 | | 20 | 28 | 36 | | 44 | |
| 5 | 13 | 21 | 29 | 37 | 45 | 53 | 61 | 69 | 77 |
| 5 | | 13 | | 21 | 29 | 37 | | 45 | |
| 6 | 14 | 22 | 30 | 38 | 46 | 54 | 62 | 70 | 78 |
| 6 | | 14 | | 22 | 30 | 38 | | 46 | |
| 7 | 15 | 23 | 31 | 39 | 47 | 55 | 63 | 71 | 79 |
| 7 | | 15 | | 23 | 31 | 39 | | 47 | |

| 0 | 8 | 16 | 24 | 32 | 40 | 48 | 56 | 64 | 72 | | | | | |
|---|---|----|----|----|----|----|----|----|----|--|--|--|--|--|
| 0 | | | | | 8 | | | | 16 | | | | | |
| 1 | 9 | 17 | 25 | 33 | 41 | 49 | 57 | 65 | 73 | | | | | |
| 1 | | | | | 9 | | | | 17 | | | | | |
| 2 | 10 | 18 | 26 | 34 | 42 | 50 | 58 | 66 | 74 | | | | | |
| 2 | | | | | 10 | | | | 18 | | | | | |
| 3 | 11 | 19 | 27 | 35 | 43 | 51 | 59 | 67 | 75 | | | | | |
| 3 | | | | | 11 | | | | 19 | | | | | |
| 4 | 12 | 20 | 28 | 36 | 44 | 52 | 60 | 68 | 76 | | | | | |
| 4 | | | | | 12 | | | | 20 | | | | | |
| 5 | 13 | 21 | 29 | 37 | 45 | 53 | 61 | 69 | 77 | | | | | |
| 5 | | | | | 13 | | | | 21 | | | | | |
| 6 | 14 | 22 | 30 | 38 | 46 | 54 | 62 | 70 | 78 | | | | | |
| 6 | | | | | 14 | | | | 22 | | | | | |
| 7 | 15 | 23 | 31 | 39 | 47 | 55 | 63 | 71 | 79 | | | | | |
| 7 | | | | | 15 | | | | 23 | | | | | |

| LDPC block length ($N_{ldpc}$) | modulation mode | Nr | maximum value of Nr | number of times of accessing memory 814 and ratio ||||||||
|---|---|---|---|---|---|---|---|---|---|---|---|
| | | | | W/C=2 ||| W/C=4 ||| W/C=8 |||
| | | | | prior art | present invention | ratio | prior art | present invention | Ratio | prior art | present invention | ratio |
| 64800 | 256QAM | 1,620 | 340 | 826,200 | 605,880 | 73.30% | 688,500 | 358,020 | 52.00% | 620,460 | 167,184 | 26.90% |
| | 64QAM | 2,160 | 255 | 827,280 | 608,256 | 73.50% | 689,040 | 359,424 | 52.20% | 619,920 | 165,888 | 26.80% |
| | 16QAM | 3,240 | 170 | 826,200 | 605,880 | 73.30% | 690,120 | 362,232 | 52.50% | 622,080 | 171,072 | 27.50% |
| | QPSK | 6,480 | 85 | 829,440 | 613,008 | 73.90% | 693,360 | 370,656 | 53.50% | 622,080 | 171,072 | 27.50% |
| 16200 | 256QAM | 1,375 | 1,375 | 835,515 | 613,008 | 73.40% | 696,195 | 362,232 | 52.00% | 626,535 | 167,184 | 26.70% |
| | 64QAM | 1,030 | 1,030 | 834,300 | 611,820 | 73.30% | 695,520 | 362,232 | 52.10% | 625,860 | 167,184 | 26.70% |
| | 16QAM | 685 | 685 | 832,680 | 611,226 | 73.40% | 694,170 | 362,232 | 52.20% | 624,510 | 167,184 | 26.80% |
| | QPSK | 340 | 340 | 826,200 | 605,880 | 73.30% | 688,500 | 358,020 | 52.00% | 620,460 | 167,184 | 26.90% |

| LDPC block length ($N_{ldpc}$) | modulation mode | Nr | maximum value of Nr | number of times of accessing memory 814 and ratio | | | | | | | | |
|---|---|---|---|---|---|---|---|---|---|---|---|---|
| | | | | W/C=2 | | | W/C=4 | | | W/C=8 | | |
| | | | | prior art | present invention | ratio | prior art | present invention | Ratio | prior art | present invention | ratio |
| 64800 | 256QAM | 1,620 | 340 | 826,200 | 605,880 | 73.30% | 688,500 | 358,020 | 52.00% | 620,460 | 167,184 | 26.90% |
| | 64QAM | 2,160 | 255 | 827,280 | 608,256 | 73.50% | 689,040 | 359,424 | 52.20% | 619,920 | 165,888 | 26.80% |
| | 16QAM | 3,240 | 170 | 826,200 | 605,880 | 73.30% | 690,120 | 362,232 | 52.50% | 622,080 | 171,072 | 27.50% |
| | QPSK | 6,480 | 85 | 829,440 | 613,008 | 73.90% | 693,360 | 370,656 | 53.50% | 622,080 | 171,072 | 27.50% |
| 16200 | 256QAM | 405 | 1,375 | 835,515 | 613,008 | 73.40% | 696,195 | 362,232 | 52.00% | 626,535 | 167,184 | 26.70% |
| | 64QAM | 540 | 1,030 | 834,300 | 611,820 | 73.30% | 695,520 | 362,232 | 52.10% | 625,860 | 167,184 | 26.70% |
| | 16QAM | 810 | 685 | 832,680 | 611,226 | 73.40% | 694,170 | 362,232 | 52.20% | 624,510 | 167,184 | 26.80% |
| | QPSK | 1,620 | 340 | 826,200 | 605,880 | 73.30% | 688,500 | 358,020 | 52.00% | 620,460 | 167,184 | 26.90% |

FIG. 16

TIME AND CELL DE-INTERLEAVING CIRCUIT AND METHOD FOR PERFORMING TIME AND CELL DE-INTERLEAVING

This application claims the benefit of Taiwan application Serial No. 104122018, filed Jul. 7, 2015, the subject matter of which is incorporated herein by reference.

BACKGROUND OF THE INVENTION

Field of the Invention

The invention relates in general to a time and cell de-interleaving circuit and method, and more particularly to a time and cell de-interleaving circuit and method capable of reducing the number of times of accessing a system memory.

Description of the Related Art

In general, before a Digital Video Broadcasting-Second Generation Terrestrial (DVB-T2) broadcast signal is transmitted, cell interleaving and time interleaving processes are performed on data to be transmitted to minimize effects that various types of interference has on transmitted data, so that the receiver may obtain correct transmitted data. After the signal is received at the receiver, time de-interleaving and cell de-interleaving processes are performed on the received signal to correctly decode the data. FIG. 1 shows a block diagram of a conventional signal receiver 100. The signal receiver 100 includes a demodulator 110, a frequency de-interleaving circuit 120, a time de-interleaving circuit 130, a cell de-interleaving circuit 140, a de-mapping circuit 150 and a decoding circuit 160. An input signal is a modulated signal (e.g., a quadrature amplitude modulation (QAM) signal based on orthogonal frequency division multiplexing (OFDM)), and is processed by the demodulator 110 to obtain an interleaved signal that includes information of two orthogonal components (I and Q) and a signal-to-noise ratio (SNR). After de-interleaving processes performed by the frequency de-interleaving circuit 120, the time de-interleaving circuit 130 and the cell de-interleaving circuit 140, the data is rearranged in a correct sequence. The processed data is then computed by de-mapping circuit 150 to restore into bit information, which is next processed (e.g., a low-density parity check (LPDC) and BCH decoding) by the decoding circuit 160 to obtain the transmitted data.

The time de-interleaving operation is performed in a unit of one time interleaving (TI) block. Each TI block includes $N_{FEC}$ forward error correction (FEC) blocks, and each FEC block includes $N_{cell}$ cells. Assume that one TI block includes four FEC blocks ($N_{FEC}=4$), and each FEC block includes 40 cells ($N_{cell}=40$). When the transmitter performs time interleaving process, the size of a dynamic random access memory (DRAM) is set as Nr rows and Nc columns, where Nr is $N_{cell}/5$ (8 in this example) and Nc is $N_{FEC} \times 5$ (20 in this example). FIG. 2a and FIG. 2b are configuration diagrams of a memory conventionally used for time interleaving process. The size of the memory is Nr×Nc cells, and the value in each grid represents the sequence of writing/reading into/from (FIG. 2a indicates the writing sequence and FIG. 2b indicates the reading sequence) memory addresses. In this example, the word read/written from/into the memory is equal to the size (e.g., 32 bits) of one cell. In the writing operation in FIG. 2a, the cells are written sequentially and vertically from the upper left corner, and a next column is written after a previous column is fully written. In the reading operation in FIG. 2b, the cells are read sequentially and horizontally from the upper left corner, and a next row is read after a previous row is completely read. Assuming that the sequences for the addresses for writing in FIG. 2a also represent the numbers of the written cells, the number sequence of the written cells is: 0, 1, 2, 3, . . . , 78, 80, . . . , 158, and 159, and the number sequence of the read cells is 0, 8, 16, 24, . . . , 155, 4, . . . , 151 and 159, hence achieving an effect of dispersing the cells.

FIG. 3 shows a block diagram of a time de-interleaving circuit and a cell de-interleaving circuit of a conventional signal receiver. A time de-interleaving circuit 130 includes a DRAM 132, a writing address generator 134 and a reading address generator 136. Through the controls of the writing address generator 134 and the reading address generator 136, the cells of a TI block are sequentially and vertically written from the upper left corner of the DRAM 132, and a next column is written after a previous column is fully written, whereas the cells are sequentially and horizontally read from the upper left corner of the DRAM 132, and a next row is read after a previous row is completely read, hence completing the time de-interleaving process. However, the numbers of columns and rows are respectively equal to the numbers of rows and columns of the transmitter, and so the size of the DRAM 132 is designed to be Nc×Nr (given the DRAM 132 is written according to a horizontal sequence and read according to a vertical sequence, the size of the DRAM 132 is Nr×Nc). FIG. 4a and FIG. 4b show sequences of writing/reading addresses of a memory of a conventional time de-interleaving process when the memory bandwidth is equal to the size of cells. Similarly, the value in each grid represents the sequence of the memory addresses that are written/read (FIG. 4a indicates the sequence of writing and FIG. 4b represents the sequence of reading), and the size of the word written/read into/from the DRAM 132 each time is also equal to the size of one cell. Thus, in the writing operation in FIG. 4a, the cells are written sequentially and vertically from the upper left corner, and a next column is written after a previous column is fully written. In the reading operation in FIG. 4b, the cells are sequentially and horizontally read from the upper left corner, and a next row is read after a previous row of completely read. The sequence of the numbers of the cells received by the DRAM 132 is the sequence of the interleaved signals: 0, 8, 16, 24, . . . , 155, 4, . . . , 151, 159. After writing to the DRAM 132 according to the sequence in FIG. 4a, the arrangement of the numbers of the cells received in the DRAM 132 is the same as the numbers of the reading sequence shown in FIG. 4b. Thus, the sequence of the numbers of the cells read from the DRAM 132 is: 0, 1, 2, 3, . . . , 79, 80, . . . , 158, 159, and the time de-interleaving operation is then complete (the DRAM 132 is written/read by 160+160=320 times). In a unit of FEC blocks (the cells numbered 0~39 are the $0^{th}$ FEC block, the cells numbered are the $1^{st}$ FEC block, and so forth), the cell de-interleaving circuit 140 then performs a cell de-interleaving process according to a permutation rule by using a cell de-interleaving (CDI) buffer 142 (generally implemented by an SRAM).

FIG. 5 shows a schematic diagram of a storage state, a permutation rule and an output sequence of cells of a conventional CDI buffer 142. The table on the left represent storage addresses of the $0^{th}$ FEC block in the CDI buffer 142, the numbers (3, 7, 11 . . . ) on the right of each row represents memory addresses (the $1^{st}$ row corresponds to memory addresses 0 to 3, the $2^{nd}$ row corresponds to memory addresses 4 to 7, . . . ), and the CDI buffer 142 sequentially fills in the received cells according to an increasing order of the memory addresses. The table in the middle shows a schematic diagram of a permutation rule of the cell de-interleaving process, the numbers represent read addresses, which are sequentially and horizontally read from the upper left corner, and a next row is read after a previous row is completely read. Thus, the reading sequence of the memory addresses is address 0, address 32, address 1, . . . , address 10, address 37, address 2, . . . , and address 34. As the storage addresses of the cells are identical to the cell numbers, the output sequence of the CDI register 142 is, 0, 32, 1, . . . , and 34 (as shown by the table on the right), thus completing the cell de-interleaving process.

In response to the design trend of system-on-chip (SoC), the DRAM 132 used by the time de-interleaving circuit 130 needs to be shared with other circuits in the system. However, due to a limited bandwidth of the DRAM 132, each circuit needs to minimize the number of times of accessing the DRAM 132 in order not to drag the performance of the system. One method for reducing the number of times of accessing the DRAM 132 is to increase the bandwidth in a way that the word read/written each time is increased. Assuming that the bandwidth of the DRAM 132 multiplied by four times (the word becomes 128 bits, and four cells are read/written each time), although the configuration of the memory is unchanged, the sequences of the addresses read/written are changed. FIG. 6a and FIG. 6b show schematic diagrams of storage addresses and reading/writing sequences of cells in a memory in a conventional time de-interleaving process and when a memory bandwidth is four times the size of cells. The vertical values (0~159) represent the numbers of the cells, and the horizontal values (0~39 in FIG. 6a, and 0~159 in FIG. 6b) represent the writing/reading sequences. FIG. 6a depicts the sequences of writing to the DRAM 132. During a writing operation, the words are sequentially and vertically written from the upper left corner. The words of the cells numbered 0, 8, 16 and 24 are written in the $0^{th}$ writing operation, the words of the cells numbered 32, 40, 48 and 56 are written in the $1^{st}$ writing operation, and so forth. Thus, a total of 40 writing operations need be performed for the 160 cells in the DRAM 132. FIG. 6b depicts the sequences of reading from the DRAM 132. During a reading operation, the words are sequentially and horizontally read from the upper left corner, with however the cells being read according to a sequence of the cells numbered 0, 1, 2, 3 . . . . That is, the words of the cells numbered 0, 8, 16 and 24 are read in the $0^{th}$ reading operation, but only the cell numbered 0 is used. The words of the cells numbered 1, 9, 17 and 25 are read in the $1^{st}$ reading operation, but only the cell numbered 1 is used, and so forth. Thus, in a writing operation, each word is read four times, and a total of 160 reading operations need to be performed for the 40 words. Using the above method for time de-interleaving the 160 cells, the total number of times of writing/reading into/from the DRAM 132 is 40+160=200 times. FIG. 7a and FIG. 7b show other schematic diagrams of storage addresses and reading/writing sequences of cells in a memory in a conventional time de-interleaving operation and when a memory bandwidth is four times the size of cells. FIG. 7a depicts the sequences of writing into the DRAM 132. In this method, although data of four cells is transmitted to the DRAM 132 each time, only one cell is written. That is, the word including the cells numbered 0, 8, 16 and 24 is written in four separate times (corresponding to $0^{th}$, $1^{st}$, $2^{nd}$ and $3^{rd}$ writing operations), and the word of the cells numbered 32, 40, 48 and 56 is written in four separate times (corresponding to the $4^{th}$, $5^{th}$, $6^{th}$ and $7^{th}$ writing operations), and so forth. Thus, the 40 words are written in 160 times. FIG. 7b depicts the sequences of reading from the DRAM 132. The reading operation is performed according to the sequences of the numbers of the cells, and so the word including the cells numbered 0, 1, 2 and 3 is read in the $0^{th}$ reading operation, the word including the cells numbered 4, 5, 6 and 7 is read in the $1^{st}$ reading operation, and so forth. Thus, 40 reading operations need to be performed for these 160 cells. Using this method for time de-interleaving, the total number of times of writing/reading into/from the DRAM 132 is 160+40=200 times.

Although increasing the bandwidth of the DRAM (the methods in FIGS. 6a/6b and FIGS. 7a/7b) reduces the number of times of writing into or reading from the DRAM 132, for a system having a high memory utilization frequency, the overall performance of the system may be further enhanced if the number of times of reading/writing the memory during time de-interleaving operations can be reduced.

SUMMARY OF THE INVENTION

The invention is directed to a time and cell de-interleaving circuit and a method for performing time and cell de-interleaving to reduce the number of times of accessing a memory.

The present invention discloses a time and cell de-interleaving circuit, which is located in a signal receiver of a communication system and used for time de-interleaving and cell de-interleaving an interleaved signal including a plurality of cells. The time and cell de-interleaving circuit includes: a first memory, storing the cells; a storage control circuit, controlling an access operation of the first memory, the access operation performed in a unit of one cell group including K cells, where K is a positive integer greater than 1; a second memory, storing the cells read from the first memory; and a rule generating unit, generating a plurality of permutation rules, writing the cells read from the first memory to the second memory according to a writing rule of the permutation rules, to cause K consecutive cells written to the second memory to be from the same cell group, and reading the cells stored in the second memory from the second memory according to a reading rule of the permutation rules, to cause the cells read from the second memory to be complete with time de-interleaving and cell de-interleaving.

The present invention further discloses a method for performing time and cell de-interleaving applied to a signal receiver of a communication system to time de-interleave and cell de-interleave an interleaved signal. The interleaved signal includes a plurality of cells. The method includes: providing a first memory for storing the cells, the first memory read and written each time in a unit of one cell group including K cells, where K is a positive integer greater than 1; providing a second memory for storing the cells read from the first memory; reading the cells from the first memory, and writing the cells to the second memory according to a writing rule of a plurality of permutation rules, K consecutive cells written to the second memory being from the same cell group; and reading the cells from the second memory according to a reading rule of the permutation rules, to cause the cells read from the second memory to be complete with time de-interleaving and cell de-interleaving.

The present invention further discloses a time and cell de-interleaving circuit, which located in a signal receiver of a communication system and used for time de-interleaving and cell de-interleaving an interleaved signal. The interleaved signal includes a plurality of cells. The time and cell de-interleaving circuit includes: a storage control circuit, controlling an access operation of a first memory, the access operation performed in a unit of one cell group including K cells, where K is a positive integer greater than 1; a second memory, storing the cells read from the first memory; and a rule generating unit, generating a plurality of permutation rules, writing the cells read from the first memory to the second memory according to a writing rule of the permutation rules, to cause K consecutive cells written to the second memory to be from the same cell group, and reading the cells stored in the second memory from the second memory according to a reading rule of the permutation rules, to cause the cells read from the second memory to be complete with time de-interleaving and cell de-interleaving.

In the time and cell de-interleaving circuit and the method for performing time and cell de-interleaving of the present invention, appropriate permutation rules are used to complete time and cell de-interleaving to reduce the number of times of accessing a memory. In one preferred embodiment of the present invention, an additional buffer is used to buffer the cells, such that the cells are allowed to first form an appropriate cell group and then be written to the memory to further reduce the number of times of accessing the memory. Compared to the prior art, the prevent invention does not rely on the same memory to complete time de-interleaving, and does not incur an excessive number of times of accessing the memory as being limited by time de-interleaving rules.

The above and other aspects of the invention will become better understood with regard to the following detailed description of the preferred but non-limiting embodiments. The following description is made with reference to the accompanying drawings.

BRIEF DESCRIPTION OF THE DRAWINGS

Figures 2A, 2B:
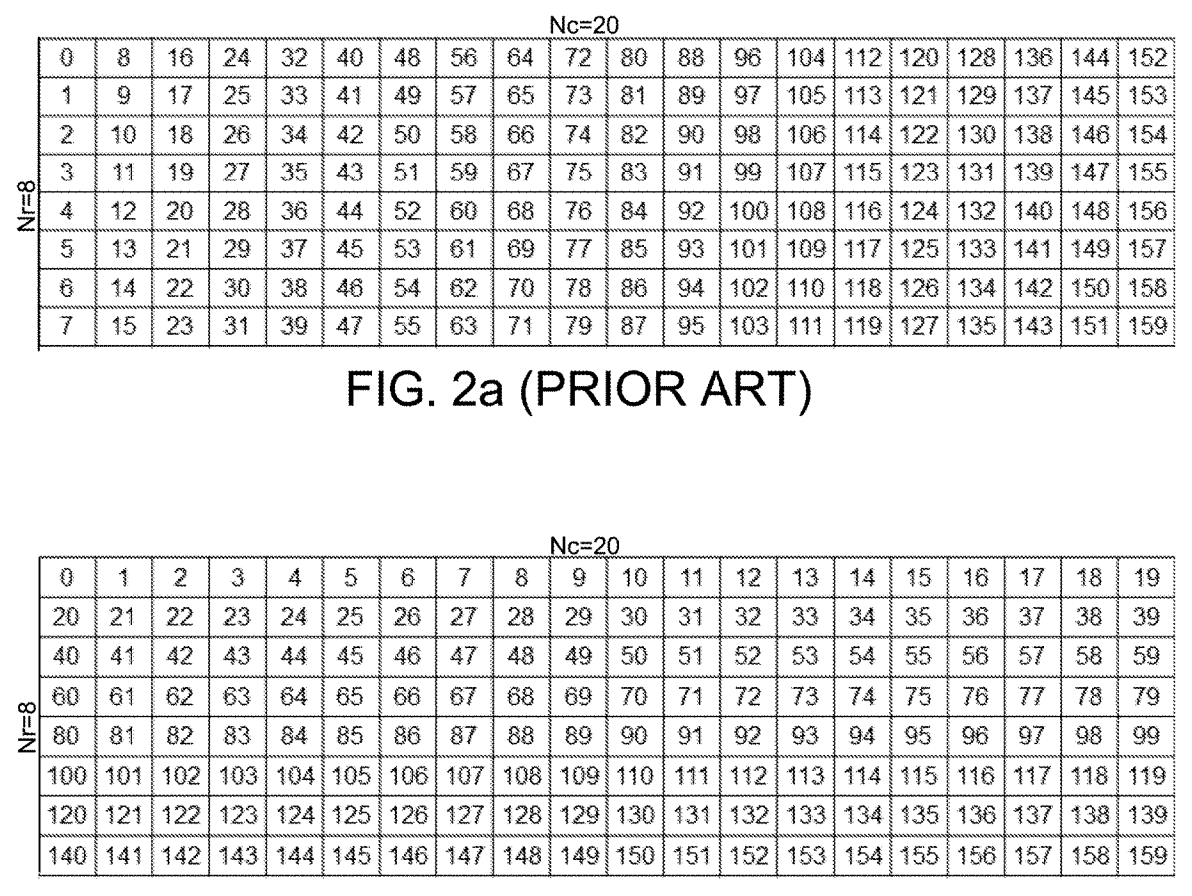

FIG. 2a and FIG. 2b are configuration diagrams of a memory conventionally used for time de-interleaving process;

FIG. 4a and FIG. 4b are sequences of writing/reading addresses of a memory in a conventional time de-interleaving process when a memory bandwidth is equal to the size of cells;

FIG. 5 is a schematic diagram of a storage state, a permutation rule and an output sequence of cells of a conventional CDI buffer 142;

Figure 6B:
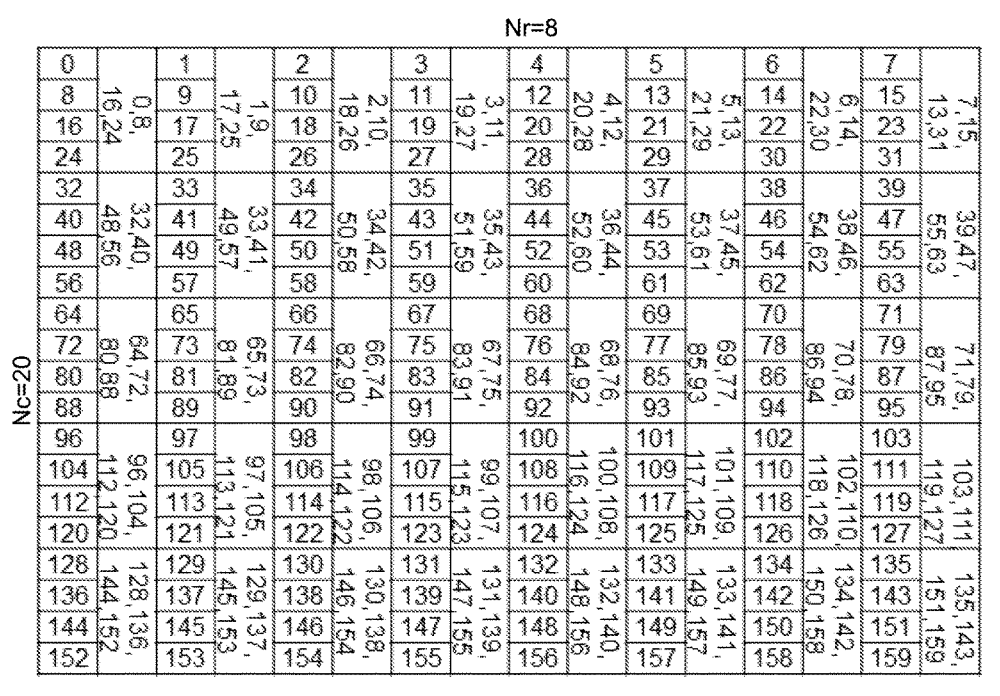

FIG. 6a and FIG. 6b are schematic diagrams of storage addresses and reading/writing sequences of cells in a memory in a conventional time de-interleaving process and when a memory bandwidth is four times the size of cells;

Figure 7A:
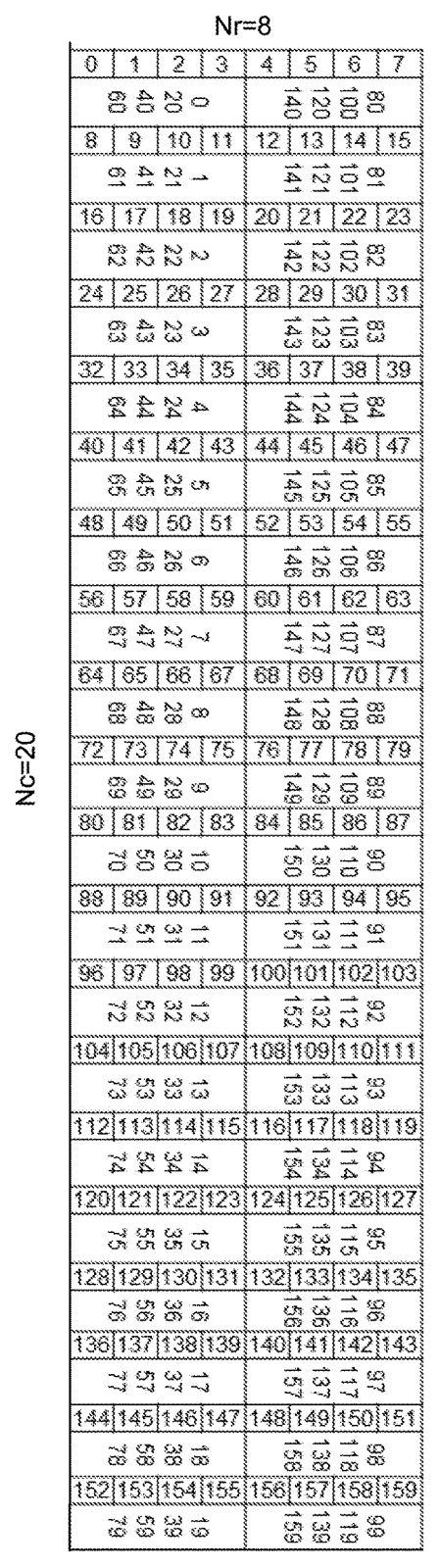
Figure 7B:
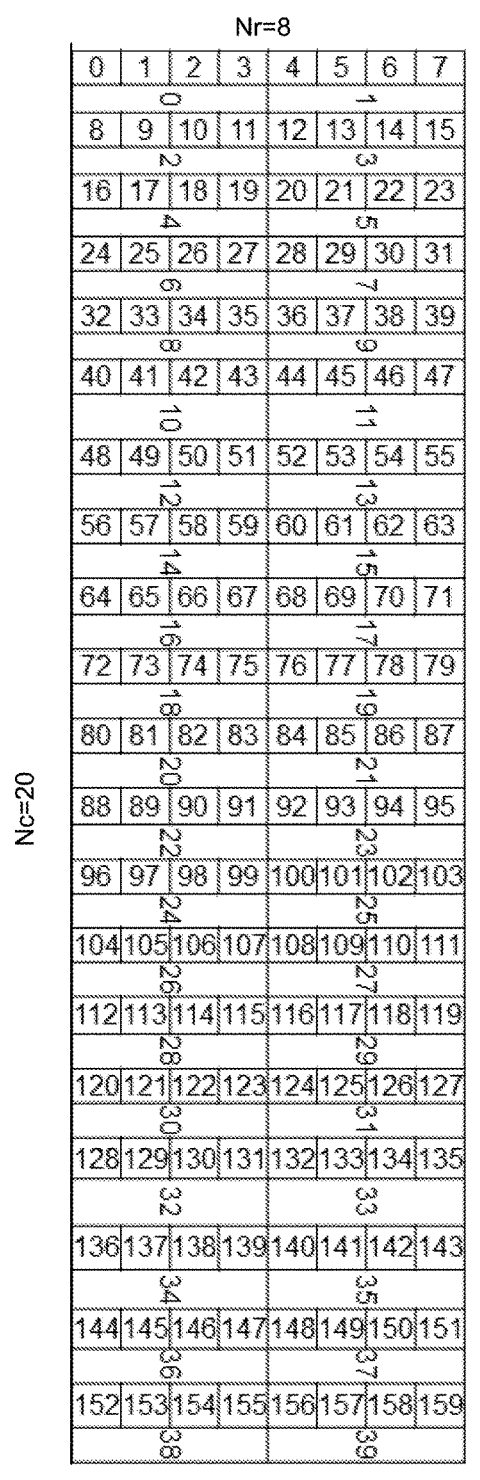

FIG. 7a and FIG. 7b are other diagrams of storage addresses and reading/writing sequences of cells in a memory in a conventional time de-interleaving process and when a memory bandwidth is four times the size of cells;

FIG. 9a to FIG. 9d are schematic diagrams of memory addresses, cell numbers, reading/writing sequences and permutation rules of a memory 814 and a memory 821 when the present invention is applied for time and cell de-interleaving and a memory bandwidth is four times the size of cells;

FIG. 10a to FIG. 10c are schematic diagrams of memory addresses, cell numbers and reading/writing sequences of a memory 814 when the present invention is applied for time and cell de-interleaving and a memory bandwidth is twice the size of cells;

FIG. 11a to FIG. 11c are schematic diagrams of memory addresses, cell numbers and reading/writing sequences of a memory 814 when the present invention is applied for time and cell de-interleaving and a memory bandwidth is eight times the size of cells;

FIG. 12 shows the number of times of reading/writing a memory 814 under different LDPC block lengths and different modulation modes, and a ratio to the number of times of reading/writing a conventional memory;

FIG. 14a to FIG. 14d are schematic diagrams of address numbers, cell numbers, read/writing sequences and permutation rules of a memory 1314, a memory 1321 and a memory 1341 when the present invention is applied for time and cell de-interleaving and a memory bandwidth is four times the size of cells;

FIG. 15a to FIG. 15c are schematic diagrams of address numbers, cell numbers and read/write sequences of a memory 1314 and a memory 1321 when the present invention is applied for time and cell de-interleaving and a memory bandwidth is twice the size of cells;

FIG. 16 shows the number of times of reading/writing a memory 1314 under different LDPC block lengths and different modulation modes, and a ratio to the number of times of reading/writing a conventional memory;

DETAILED DESCRIPTION OF THE INVENTION

Technical terms of the application are based on the general definition in the technical field of the application. If the application describes or explains one or some terms, definitions of the terms are based on the description or explanation of the application.

The present invention discloses a time and cell de-interleaving circuit and a method for performing time and cell de-interleaving capable of reducing the number of times of accessing a memory. In possible implementations, one skilled person in the art may choose equivalent elements or steps to implement the disclosure based on the disclosure of the application. That is, the implementation of the disclosure is not limited in the embodiments disclosed in the disclosure. Further, a part of the elements included in the time and cell de-interleaving circuit of the disclosure may be individually known elements. Without affecting the full disclosure and possible implementation of the device, details of the known elements are omitted. Further, the method for performing time and cell de-interleaving of the present invention may be performed by the time and cell de-interleaving circuit of the present invention or an equivalent device. Without affecting full disclosure of the present invention and possible implementation, the description of the method of the application focuses on the steps instead of hardware.

Figure 1:
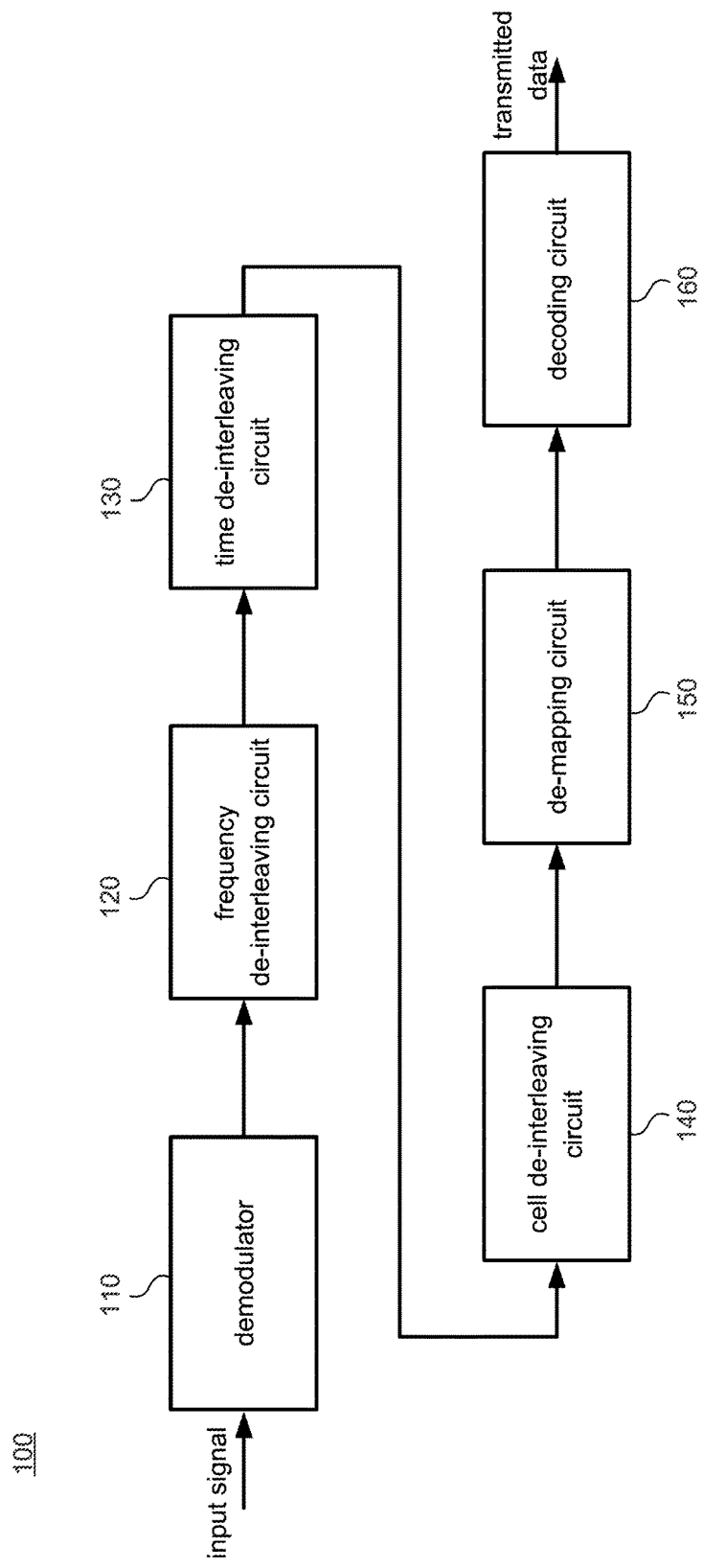
FIG. 1 is a block diagram of a conventional signal receiver.
Figure 3:
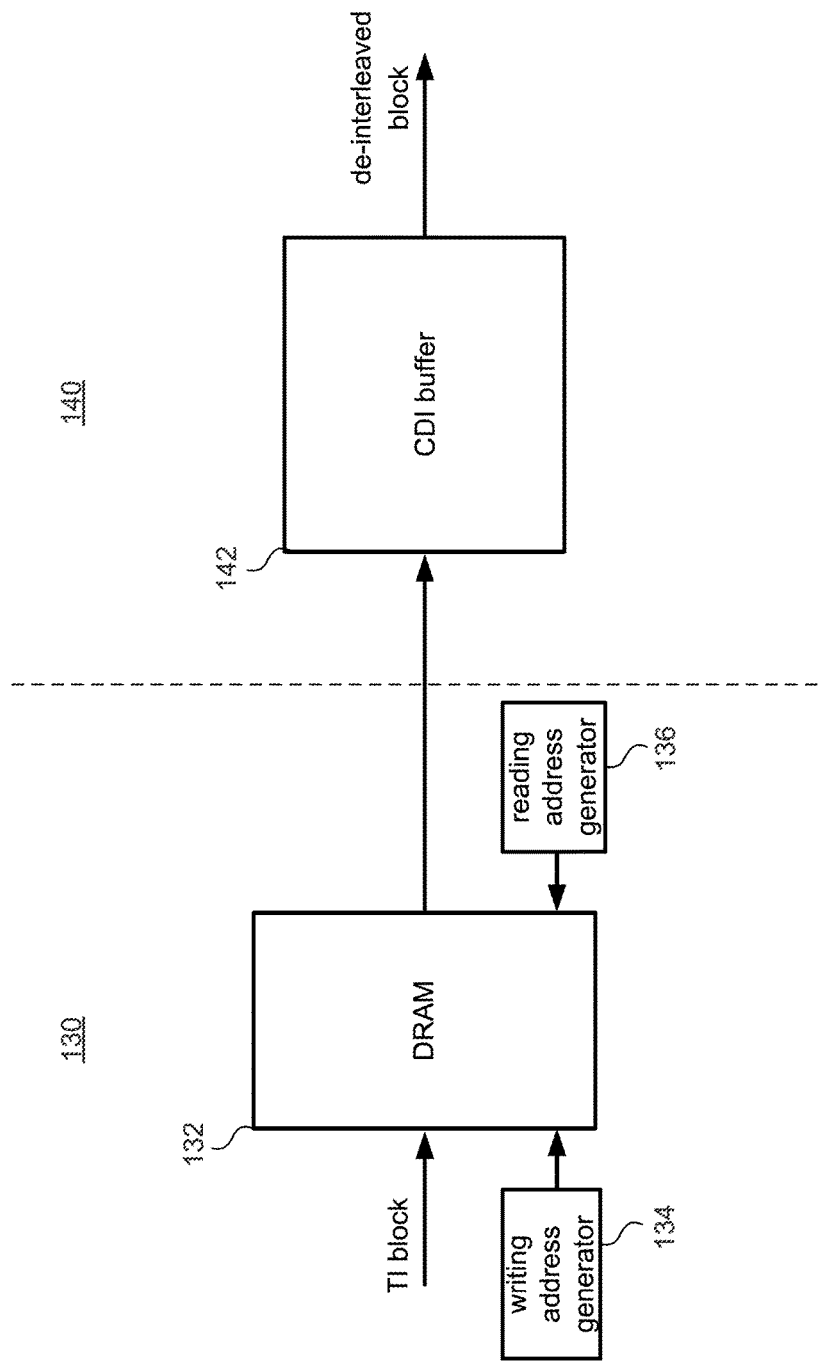
FIG. 3 is a block diagram of a time de-interleaving circuit and a cell de-interleaving circuit of a conventional signal receiver.
Figure 8:
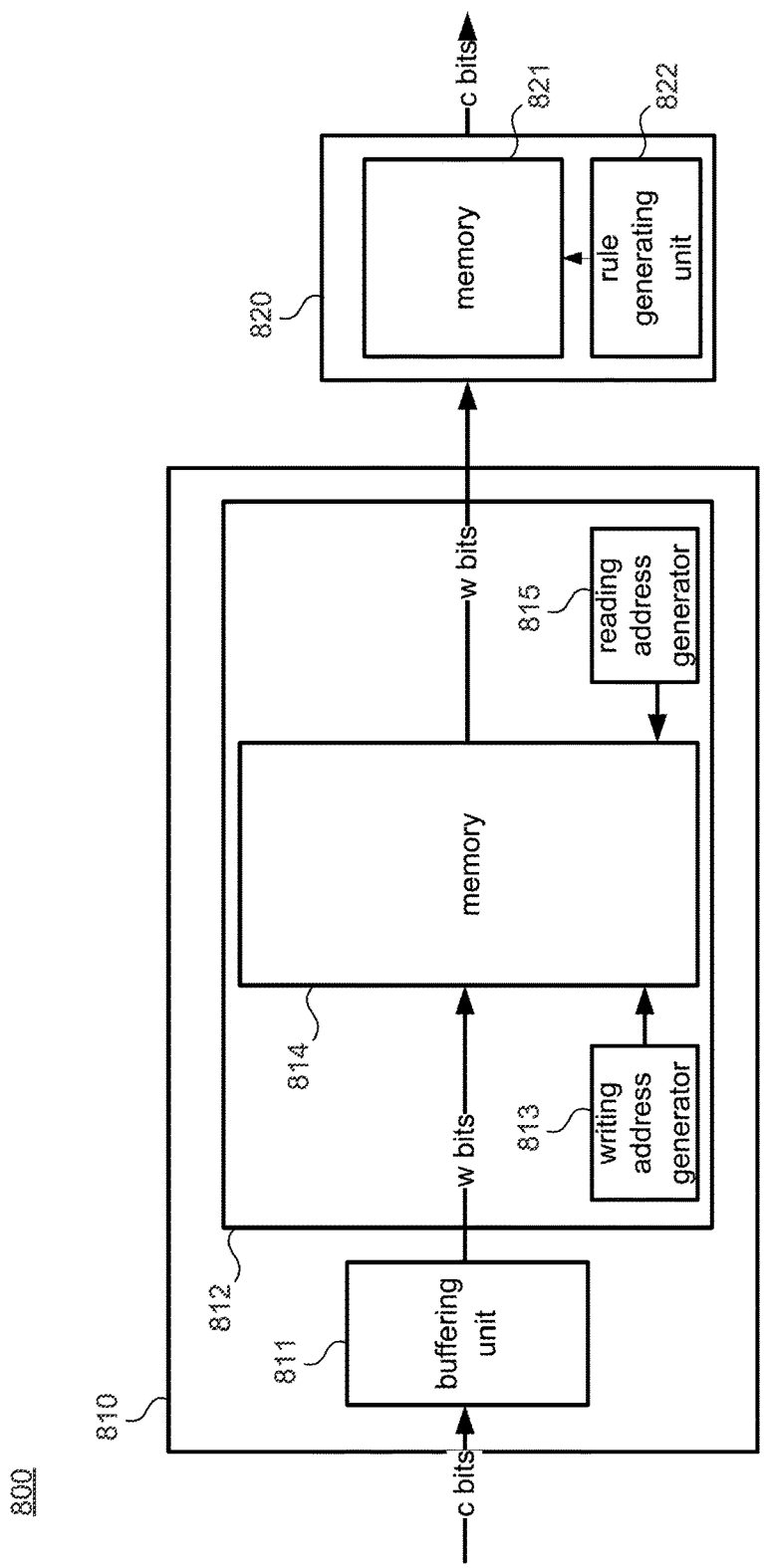
FIG. 8 is a function block diagram of a time and cell de-interleaving circuit according to an embodiment of the present invention.
Figure 8A:
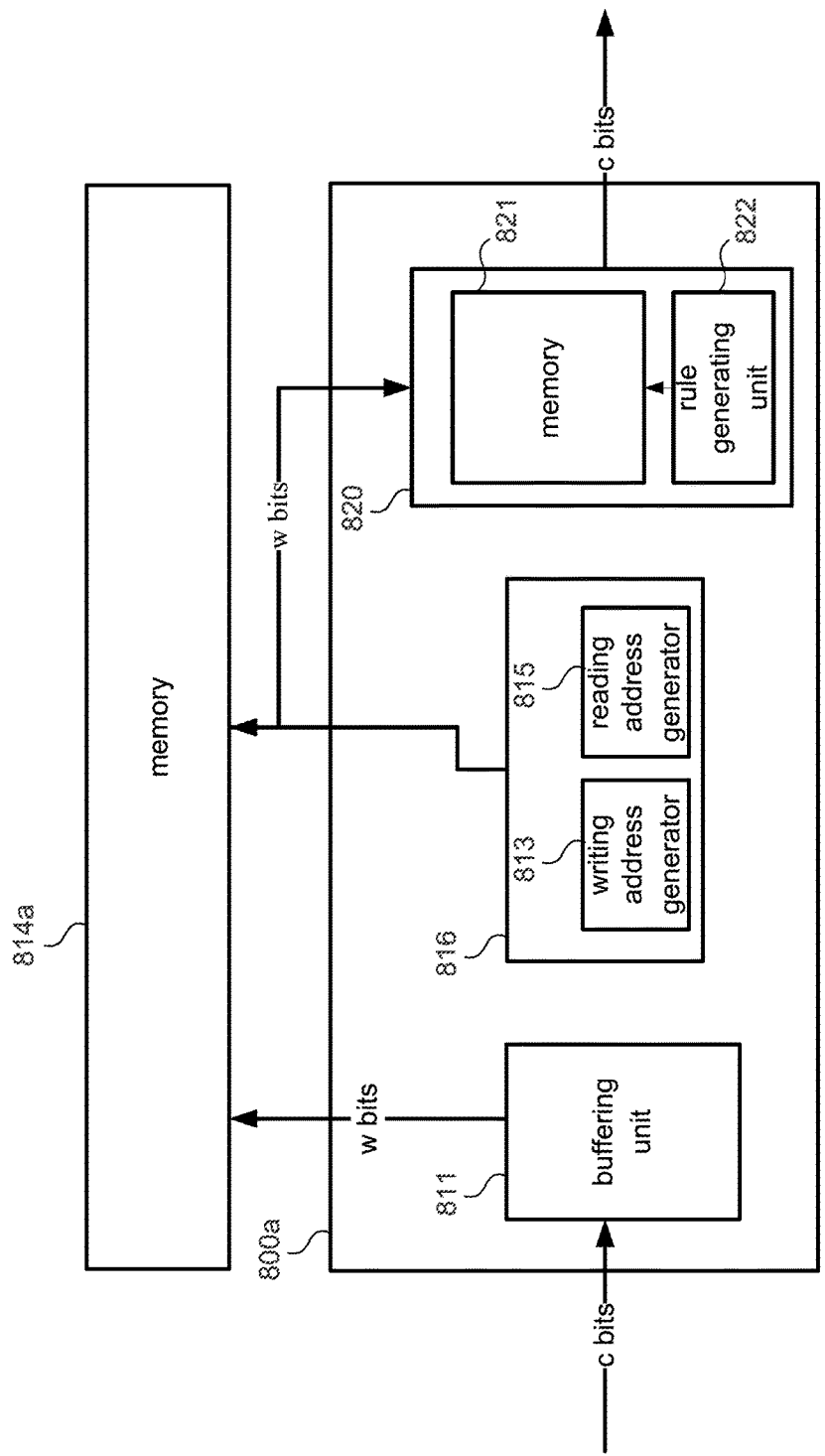
FIG. 8a is a function block diagram of a time and cell de-interleaving circuit according to another embodiment of the present invention.

FIG. 8 shows a function block diagram of a time and cell de-interleaving circuit according to an embodiment of the present invention. A time and cell de-interleaving circuit 800 includes a storage circuit 810 and a de-interleaving operation circuit 820. The storage circuit 810 includes a buffering unit 811 and a memory module 812. In the embodiment, the bandwidth of the memory module 812 is w bits (i.e., a word accessed each time is w bits), and the size of one cell is c bits. After the buffering unit 811 (e.g., a first-in-first-out (FIFO) buffer) stores w/c cells (i.e., one word, w bits), the w/c cells are together written into the memory 814 of the memory module 812. The memory module 812 includes a writing address generator 813 and a reading address generator 815, which respectively generate target memory addresses for writing and reading operations of the memory 814. The writing address generator 813 and the reading address generator 815 form a storage control circuit of the memory 814. The de-interleaving operation circuit 820 includes a memory 821 and a rule generating unit 822. The memory 821 may be implemented by a static random access memory (SRAM). The rule generating unit 822 generates a plurality of permutation rules. The cells outputted from the storage circuit 810 are written into and read from the memory according to these permutation rules to complete time and cell de-interleaving. The output of the de-interleaving operation circuit 820 is a result that has undergone time de-interleaving and cell de-interleaving. In this embodiment, the memory 814 is included in the time and cell de-interleaving circuit 800. As shown in FIG. 8a, in practice, the time and cell de-interleaving circuit may also buffer the cells of the interleaved signal by using an external memory. At this point, the time and cell de-interleaving circuit does not internally include the memory 814, and the function of the memory 814 is replaced by an external memory 814a. The time and cell de-interleaving circuit 800a controls the access operation of the interleaved signal from the memory 814a by using the storage control circuit 816.

Figures 9A, 9B:
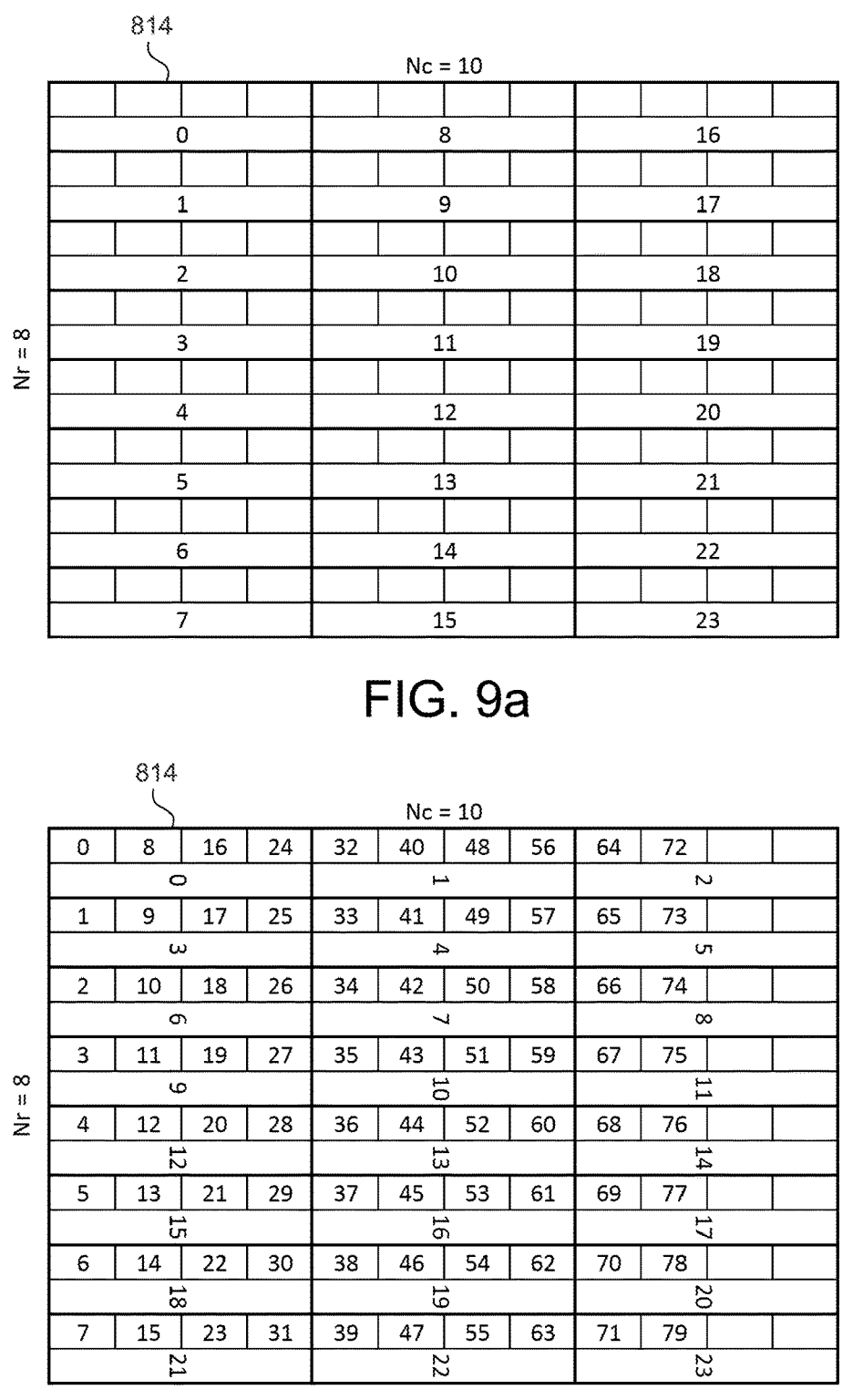

FIG. 9a, FIG. 9b, FIG. 9c and FIG. 9d are schematic diagrams of memory addresses, cell numbers, reading/writing sequences and permutation rules of the memory 814 and the memory 821 when the present invention is applied for time de-interleaving and a memory bandwidth is four times the size of cells. FIG. 9a depicts address numbers of the memory 814. There are a total of 24 (0 to 23) addresses, and each address may be written by one cell group (including four cells). FIG. 9b depicts a sequence for writing to the memory 814. The cell groups are written sequentially and horizontally from the upper left corner, and a next row is written after a previous row is fully written. The writing address generator 813 generates addresses according to a rule below:

$$\text{for } \left(i = 0 : i < \left\lceil \frac{N_c}{4} \right\rceil \times N_r : i = i+1\right)\{$$

$$C_i = i \bmod \left\lceil \frac{N_c}{4} \right\rceil$$

$$K_i = i \operatorname{div} \left\lceil \frac{N_c}{4} \right\rceil$$

$$WR_i = C_i \times N_r + R_i$$

$$\}$$

In the above, i represents the number of the cell group that the buffering unit 811 sequentially outputs, there are a total of $$\left(\frac{N_c}{4}\right) \times N_r$$

cell groups (the divisor 4 means that each word includes four cells), mod is an operator for obtaining the remainder, and div is an operator for obtaining the quotient, and $WR_i$ is a written address. Thus, written addresses and written contents are as follows. In the $0^{th}$ writing operation, the cell group including cells numbered {0, 8, 16, 24} is written to the memory address 0; in the $1^{st}$ writing operation, the cell group including cells numbered {32, 40, 48, 56} is written to the memory address 8; in the $2^{nd}$ writing operation, the cell group including cells numbered {64, 72, empty string, empty string} is written to the memory address 16 (the empty string is null data, and serves a purpose of forming a cell group with meaningful data); . . . ; in the $22^{nd}$ writing operation, the cell group including cells numbered {39, 47, 55, 63} is written to the memory address 15; and in the $23^{rd}$ writing operation, the cell group including cells numbered {71, 79, empty string, empty string} is written to the memory address 23.

Figures 9C, 9D:
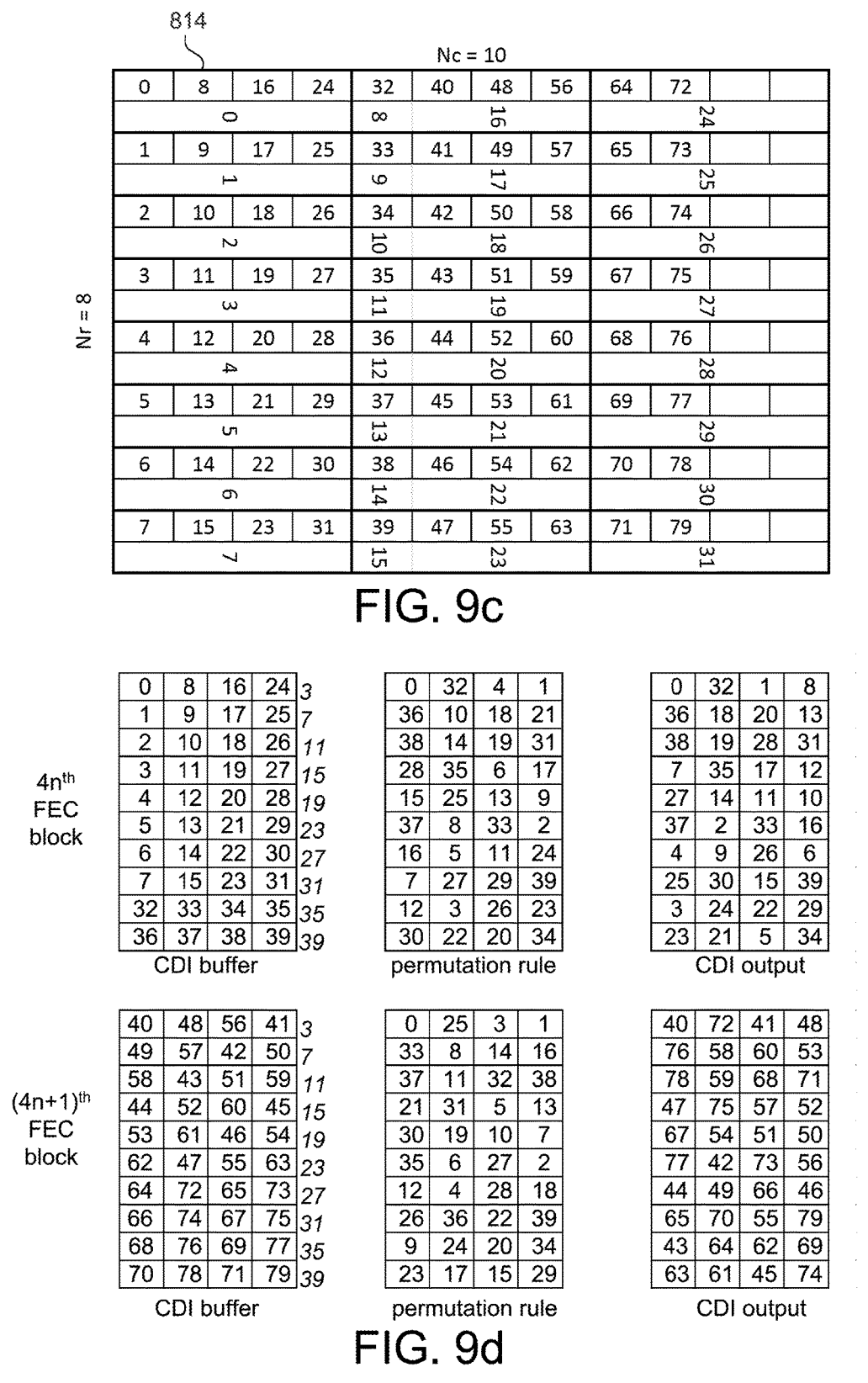

FIG. 9c depicts the sequence of reading from the memory 814. The cell groups are sequentially and vertically read from the upper left corner, and a next column is read after a previous column is completely read. The reading address generator 815 generates addresses according to a rule below, and the cell groups read from the memory 814 are then written to the memory 821 according to rules below:

$$\text{for } \left(i = 0 : i < \left(\frac{N_c}{5} \times 2\right) \times N_r : i = i+1\right)\{$$

$$C_i = (i \operatorname{div} 8 N_r) \times 5 N_r \mid ((i \bmod 8 N_r) \mid N_r) \operatorname{div}(2 N_r)$$

$$R_i = i \bmod N_r$$

$$RD_i = C_i \times N_r + R_i$$

Writing into the memory 821:

```
{
    if ((i div N_r) mod 8) = 0, DRAM[0: 32 × 4 − 1]
        (4 cells, when r mod 4 = 0)
    else if ((i div N_r) mod 8) = 1, DRAM[0:32 × 1 − 1]
        (1 cell, when r mod 4 = 0)
    else if ((i div N_r) mod 8) = 2, DRAM[32 × 1:32 × 4 − 1]
        (3 cells, when r mod 4 = 1)
    else if ((i div N_r) mod 8) = 3, DRAM[0:32 × 2 − 1]
        (2 cells, when r mod 4 = 1)
    else if ((i div N_r) mod 8) = 4, DRAM[32 × 2:32 × 4 − 1]
        (2 cells, when r mod 4 = 2)
    else if ((i div N_r) mod 8) = 5, DRAM[0:32 × 3 − 1]
        (3 cells, when r mod 4 = 2)
    else if ((i div N_r) mod 8) = 6, DRAM[32 × 3:32 × 4 − 1]
        (1 cell, when r mod 4 = 3)
    else if ((i div N_r) mod 8) = 7, DRAM[0:32 × 4 − 1]
        (4 cells, when r mod 4 = 3)
}
}
```

$RD_i$ is an address for reading from the memory 814. It should be noted that, only a part of the cells of the cell group read from the memory 814 are written to the memory 821 in some situations. As shown by the above rules, "DRAM[X: Y]" represent bit addresses of the read cell group to be written to the memory 821. For example, "DRAM[0:127]" means that all of the 128 bits in the cell group (i.e., four cells) are to be written to the memory 821; "DRAM[0:31]"

and "DRAM[63:127]" mean that data of the first 32 bits (i.e., one cell) and the last 64 bits (i.e., two cells) is to be written to the memory 821, and so forth. In the above, r represents the number of the FEC block. It is discovered that, in this embodiment, there are four types of distributions of all of the cells of one FEC block in the memory 821:

1. For the FEC block numbered 4n (where n is a positive integer greater than 0), all data of 8 cell groups is successively written, and data of the $1^{st}$ cell of the 8 following cell groups is then successively written.

2. For the FEC block numbered 4n+1, data of the last 3 cells of 8 cell groups is successively written, and data of the first 2 cells of the 8 following cell groups is then successively written.

3. For the FEC block numbered 4n+2, data of the last 2 cells of 8 cell groups is successively written, and data of the first 3 cells of the 8 following cell groups is then successively written.

4. For the FEC block numbered 4n+3, data of the last cell of 8 cell groups is successively written, and all data of the 8 following cell groups is then successively written.

Thus, read addresses and read contents of the memory 814, and contents outputted to the de-interleaving operation circuit 820 from the memory 814 are as follows. In the $0^{th}$ reading operation, the cell group including cells numbered {0, 8, 16, 24} are read from the memory address 0, and all of the read data (DRAM[0:127]) is outputted; in the $1^{st}$ reading operation, the cell group including cells numbered {1, 9, 17, 25} is read from the memory address 1, and all of the read data (DRAM[0:127]) is outputted; . . . ; in the $7^{th}$ reading operation, the cell group including cells numbered {7, 15, 23, 31} is read from the memory address 7, and all of the read data (DRAM[0:127]) is outputted; in the $8^{th}$ reading operation, the cell group including cells numbered {32, 40, 48, 56} is read from the memory address 8, and the first cell (DRAM[0:31]) of the read data is outputted; . . . ; in the $15^{th}$ reading operation, the cell group including cells numbered {39, 47, 55, 63} is read from the memory address 15, and the first cell (DRAM[0:31]) of the read data is outputted; in the $16^{th}$ reading operation, the cell group including cells numbered {32, 40, 48, 56} is read from the memory address 8, and the last 3 cells (DRAM[32:127]) of the read data are outputted; . . . , in the $23^{rd}$ reading operation, the cell group including cells numbered {39, 47, 55, 63} is read from the memory address 15, and the last three cells (DRAM[32:127]) of the read data are outputted; in the $24^{th}$ reading operation, the cell group including cells numbered {64, 72, empty string, empty string} is read from the memory address 16, and the first two cells (DRAM[0:63]) of the read data are outputted; . . . ; in the $31^{st}$ reading operation, cell group including cells numbered {71, 79, empty string, empty string} is read from the memory address 23, and the first two cells (DRAM[0:63]) of the read data are outputted.

The rule generating unit 822 may generate a plurality of permutation rules, including writing rules and reading rules. FIG. 9d shows a schematic diagram of a storage state, a permutation rule and an output sequence of the memory 821 in the de-interleaving operation circuit 820 according to an embodiment of the present invention. In one preferred embodiment, when the cells are written to the memory 821, the cells are written to the memory 821 according to an increasing order of the addresses of the memory 821 as well as the sequence of reading the cells from the memory 814. Taking the $4n^{th}$ FEC block for example, it is written according to the sequence of the cells outputted from the memory 814 to obtain the result shown on the left of the drawing. The memory 821 is read according to the reading rule shown in the middle of the drawing to obtain the cell de-interleaved result shown on the right of the drawing. For the $(4n+1)^{th}$ FEC block, it has the same writing rule as the writing rule of the $4n^{th}$ FEC block but a different reading rule. The reason is that, in this embodiment (w/c=4), the cells of one FEC block have four types of distributions (as previously described), and so the same writing rule needs to coordinate with four different reading rules. These four reading rules may be represented as follows:

For the block numbered 4n, the reading rule of $L_{r,0}(q)$ is used:

$$L_{r,0}(q) = \begin{cases} \text{if } L_r(q) < N_r \times 4, & (L_r(q) \bmod N_r) \times 4 + (L_r(q) \text{div} N_r) \\ \text{else,} & L_r(q) \end{cases}$$

For the block numbered 4n+1, the reading rule of $L_{r,1}(q)$ is used:

$$L_{r,1}(q) = \begin{cases} \text{if } L_r(q) < N_r \times 3, & (L_r(q) \bmod N_r) \times 3 + (L_r(q) \text{div } N_r) \\ \text{else,} & (L_r(q) \bmod N_r) \times 2 + (L_r(q) \text{div } N_r) + (N_r - 1) \times 3 \end{cases}$$

For the block numbered 4n+2, the reading rule of $L_{r,2}(q)$ is used:

$$L_{r,2}(q) = \begin{cases} \text{if } L_r(q) < N_r \times 2, & (L_r(q) \bmod N_r) \times 2 + (L_r(q) \text{div } N_r) \\ \text{else,} & (L_r(q) \bmod N_r) \times 3 + (L_r(q) \text{div } N_r) + (N_r - 1) \times 2 \end{cases}$$

For the block numbered 4n+3, the reading rule of $L_{r,3}(q)$ is used:

$$L_{r,3}(q) = \begin{cases} \text{if } L_r(q) < N_r \times 1, & (L_r(q) \bmod N_r) \times 1 + (L_r(q) \text{div } N_r) \\ \text{else,} & (L_r(q) \bmod N_r) \times 4 + (L_r(q) \text{div } N_r) + (N_r - 1) \times 1 \end{cases}$$

Wherein, $L_r(q)$ is the reading rule of the sequence of the input cells having undergone time de-interleaving (corresponding to a simple drawing in FIG. 5), and is used for performing cell de-interleaving. $L_r(q)$ is usually specified in the specifications of broadcasting standards. For example, when the time and cell de-interleaving circuit of the present invention is applied to a DVB-T2 system, the corresponding $L_r(q)$ may be obtained from the DVB-T2 specifications.

In another embodiment, there are four writing rules (used in turn by the FEC blocks numbered 4n, 4n+1, 4n+2 and 4n+3), and there is only one reading rule. These four reading rules may be represented as follows:

The writing rule of the FEC block numbered 4n is:

```
for (i = 0; i < N_r × 4; i = i + 1){
    CDI_WR_i = (i div 4) + (i mod 4) × N_r
}
for (i = N_r × 4; i < N_r × 5; i = i + 1){
    CDI_WR_i = i
}
```

The writing rule of the FEC block numbered 4n+1 is:

```
for (i = 0; i < N_r × 3; i = i + 1){
    CDI_WR_i = (i div 3) + (i mod 3) × N_r
}
for (i = N_r × 3; i < N_r × 5; i = i + 1){
    j = i − 3N_r
    CDI_WR_i = (j div 2) + (j mod 2) × N_r + 3N_r
}
```

The writing rule of the FEC block numbered 4n+2 is:

```
for (i = 0; i < N_r × 2; i = i + 1){
    CDI_WR_i = (i div 2) + (i mod 2) × N_r
}
for (i = N_r × 2; i < N_r × 5; i = i + 1){
    j = i − 2N_r
    CDI_WR_i = (j div 3) + (j mod 3) × N_r + 2N_r
}
```

The writing rule of the FEC block numbered 4n+3 is:

```
for (i = 0; i < N_r × 1; i = i + 1){
    CDI_WR_i = i
}
for (i = N_r × 1; i < N_r × 5; i = i + 1){
    j = i − N_r
    CDI_WR_i = (j div 4) + (j mod 4) × N_r + N_r
}
```

Wherein, CDI_WRi is the writing address for writing the $i^{th}$ cell to the memory 821.

In practice, the result of writing the cells outputted from the storage circuit 810 to the memory 821 according to the above sequence is equivalent to the result of sequentially writing the cells having undergone time de-interleaving to the memory 821, i.e., as shown by the CDI buffer in FIG. 5. Thus, as the reading rule of this embodiment is the rule of a conventional cell de-interleaving process (as the permutation rule shown in FIG. 5), the final output result of the de-interleaving operation circuit 820 is a result that is complete with time de-interleaving and cell de-interleaving.

It is known from the foregoing description that, to reduce the number of times of accessing the memory 814, the cells have not yet undergone time de-interleaving when they are read out from the memory 814. Thus, when generating the permutation rules, the rule generating unit 822 needs to simultaneously consider time interleaving characteristics and cell interleaving characteristics of the cells to accordingly generate appropriate permutation rules, such that the cells of the interleaved signal are simultaneously complete with time de-interleaving and cell de-interleaving after the cells are accessed from/to the memory 821. In practice, the rule generating unit 822 may be a storage control circuit of the memory 821, and may be formed by a logic circuit. The rule generating unit 822 learns the time de-interleaving characteristics and the cell de-interleaving characteristics of the cells of the interleaved signal according to the broadcasting standard of the interleaved signal, and obtains the permutation rules according to the rules of the cells accessed from/to the memory 814. Further, the rule generating unit 822 writes the cells read from the memory 814 to the memory 821 according to the permutation rules to complete time de-interleaving and cell de-interleaving.

Figures 10A, 10B:
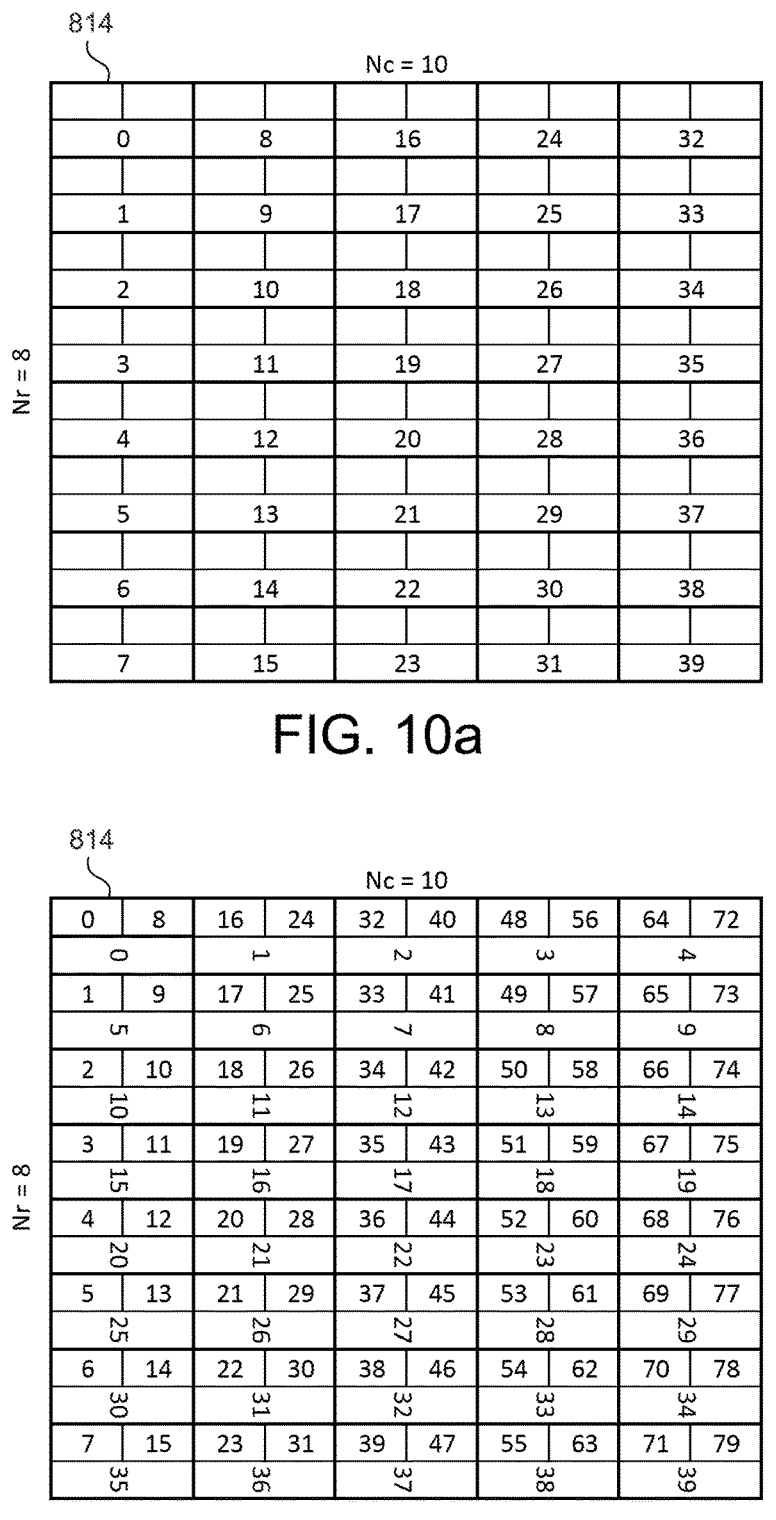

FIG. 10a, FIG. 10b and FIG. 10c show schematic diagrams of memory addresses, cell numbers and reading/writing sequences of the memory 814 when the present invention is applied for time and cell de-interleaving and a memory bandwidth is twice the size of cells. FIG. 10a depicts the address numbers of the memory 814. There are 40 (0 to 39) addresses, and each of the addresses may be written by one cell group (including two cells). FIG. 10b depicts the sequence for writing to the memory 814. The cell groups are written sequentially and horizontally from the upper left corner, and a next row is written after a previously row is fully written. The writing address generator 813 generates the addresses according to the rule below:

$$\text{for } \left(i = 0; i < \left\lceil \frac{N_c}{2} \right\rceil \times N_r; i = i+1\right)\{$$
$$C_i = i \bmod \left\lceil \frac{N_c}{2} \right\rceil$$
$$R_i = i \text{ div } \left\lceil \frac{N_c}{2} \right\rceil$$
$$WR_i = C_i \times N_r + R_i\}$$

Wherein, i represents the number of the cell group that the buffer unit 811 sequentially outputs. There are a total of $$\left(\frac{N_c}{2}\right) \times N_r$$

cell groups (the divisor 2 means that each word includes two cells).

FIG. 10c depicts the sequence for reading the memory 814. The cell groups are read sequentially and vertically from the upper left corner, and a next column is read after a previous column is completely read. The reading address generator 815 generates the addresses according to the rule below:

$$\text{for}$$
$$\left(i = 0; i\left(\frac{N_c}{5} \times 3\right) \times N_r; i = i+1\right)$$
$$\{C_i = (i \text{ div } 6N_r) \times 4N_r + ((i \bmod 6N_r) + N_r)div(2N_r)$$
$$R_i = i \bmod N_r$$
$$RD_i = C_i \times N_r + R_i$$

writing to the memory 821:

```
{
if ((i div N_r) mod 6) = 0, DRAM[0: 32 × 2 − 1]
    (2 cells, when r mode 2 = 0)
else if ((i div N_r) mod 6) = 1, DRAM[0:32 × 2 − 1]
    (2 cells, when r mode 2 = 0)
else if ((i div N_r) mod 6) = 2, DRAM[0:32 × 1 − 1]
    (1 cell, when r mode 2 = 0)
else if ((i div N_r) mod 6) = 3, DRAM[0:32 × 2 − 1]
    (1 cell, when r mode 2 = 1)
else if ((i div N_r) mod 6) = 4, DRAM[0:32 × 2 − 1]
    (2 cells, when r mode 2 = 1)
else if ((i div N_r) mod 6) = 5, DRAM[0:32 × 2 − 1]
    (2 cells, when r mode 2 = 1)
```

It should be noted that, only a part of the cells of the cell group read from the memory 814 are written to the memory 821 in some situations. It is discovered that, in this embodiment, there are only two types of distributions for all of the cells of one FEC block in the memory 821:

1. For the FEC block numbered 2n, all data of 16 cell groups is successively written, and a first half of data of 8 following cell groups is successively written.

2. For the FEC block numbered 2n+1, data of a second half of 8 cell groups is successively written, and all data of 16 following cell groups is then successively written.

The plurality of permutation rules generated by the rule generating unit 822 include writing rules and reading rules. In one preferred embodiment, when the cells are written to the memory 821, the cells are written to the memory 821 according to an increasing order of the addresses of the memory 821 as well as the sequence of reading the cells from the memory 814. Thus, in this embodiment (w/c=2), there are two types of distributions for the cells of one FEC block in the memory 821 (as previously described), and so the same writing rule needs to coordinate with two different reading rules (used in turn by the FEC blocks numbered 2n and 2n+1). These two reading rules may be represented as follows:

For the block numbered 2n, the reading rule of $L_{r,0}(q)$ is used:

$$L_{r,0}(q) = \begin{cases} \text{if } L_r(q) < N_r \times 2, & (L_r(q) \bmod N_r) \times 2 + (L_r(q) \text{div } N_r) \\ \text{else if } L_r(q) < N_r \times 4, & (L_r(q) \bmod N_r) \times 2 + \\ & (L_r(q) \text{div } N_r) + (N_r - 1) \times 2 \\ \text{else,} & L_r(q) \end{cases}$$

For the block numbered 2n+1, the reading rule of $L_{r,1}(q)$ is used:

$$L_{r,1}(q) = \begin{cases} \text{if } L_r(q) < N_r \times 1, & L_r(q) \\ \text{else if } L_r(q) < N_r \times 3, & (L_r(q) \bmod N_r) \times 2 + (L_r(q) \text{div } N_r) + \\ & (N_r - 1) \times 1 \\ \text{else,} & (L_r(q) \bmod N_r) \times 2 + (L_r(q) \text{div } N_r) + \\ & (N_r - 1) \times 3 \end{cases}$$

In another preferred embodiment, there are two writing rules (used in turn by the FEC blocks numbered 2n and 2n+1). These two writing rules may be represented as follows:

The writing rule of the FEC block numbered 2n is:

```
for (i = 0; i < N_r × 2; i = i + 1){
    CDI_WR_i = (i div 2) + (i mod 2) × N_r
}
for (i = N_r × 2; i < N_r × 4; i = i + 1){
    CDI_WR_i = ((i − 2N_r) div 2) + ((i − 2N_r) mod 2) × N_r + 2N_r
    = (i div 2) (i mod 2) × N_r | N_r
}
for (i = N_r × 4; i < N_r × 5; i = i + 1){
    CDI_WR_i = i
}
```

The writing rule of the FEC block numbered 2n+1 is:

```
for (i = 0; i < N_r × 1; i = i + 1){
    CDI_WR_i = i
}
for (i = N_r × 1; i < N_r × 3; i = i + 1){
    CDI_WR_i = ((i − N_r) div 2) + ((i − N_r) mod 2) × N_r + N_r
}
for (i = N_r × 3; i < N_r × 5; i = i + 1){
    CDI_WR_i = ((i − 3N_r) div 2) + ((i − 3N_r) mod 2) × N_r + 3N_r
}
```

The corresponding reading rule is the rule of a conventional cell de-interleaving process.

Figures 11A, 11B:
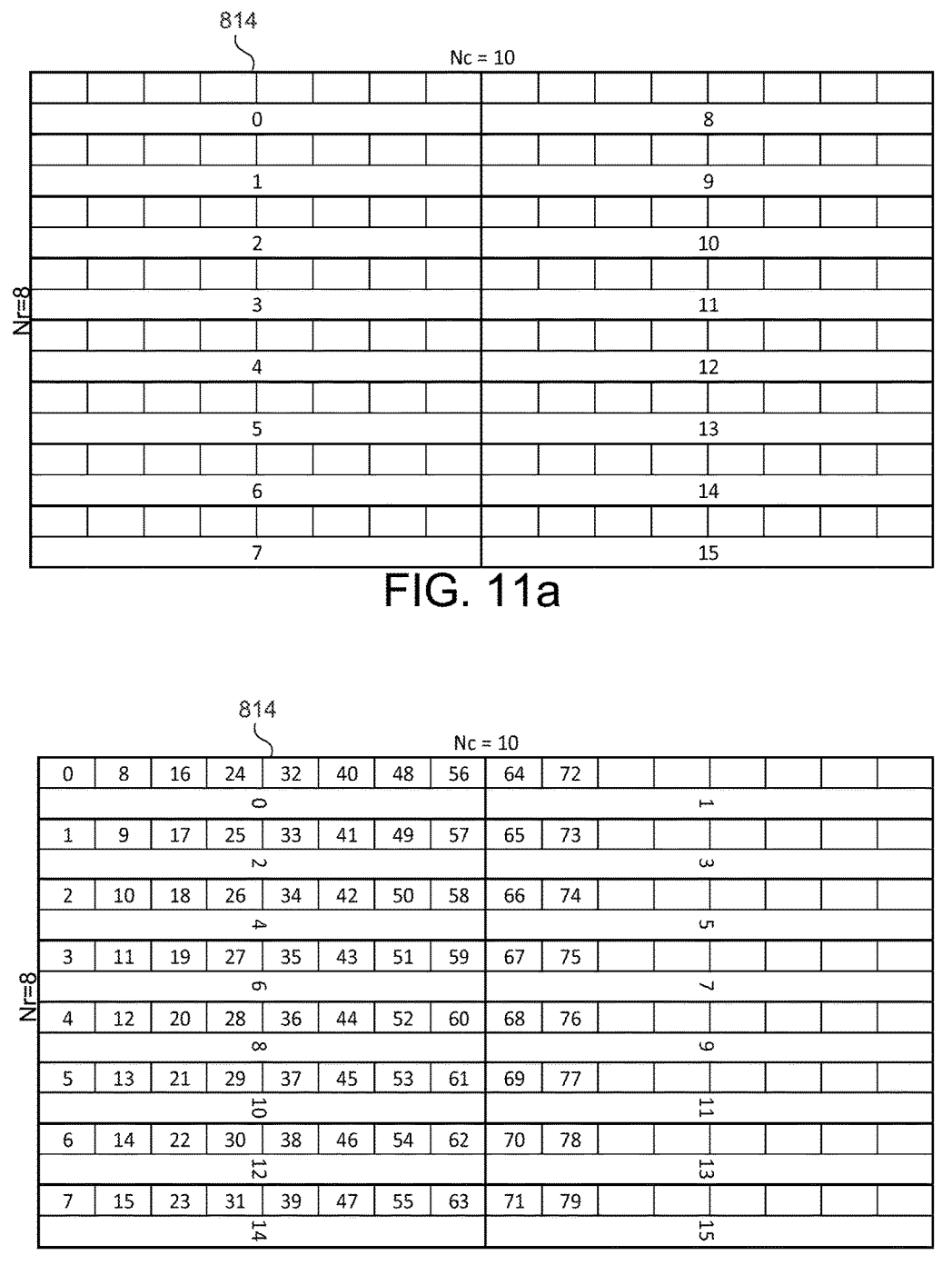

FIG. 11a, FIG. 11b and FIG. 11c show schematic diagrams of memory addresses, cell numbers and reading/writing sequences of the memory 814 when the present invention is applied for time and cell de-interleaving and a memory bandwidth is eight times the size of cells. Operation details may be deduced by one person skilled in the art based on the above embodiments, and shall be omitted herein.

FIG. 12 shows the number of times of reading/writing the memory 814 (when the memory bandwidth is twice, four times and eight times the size of cells) under different LDPC block lengths and different modulation modes, and the ratio to the number of times of reading/writing a conventional memory. The results show that, under the same LDPC block length and the same modulation mode, regardless of the multiple (w/c) of the bandwidth size to the size of cells, compared to the prior art, the present invention effectively reduces the number of times of accessing (reading/writing) the memory, and such effect is particularly significant as w/c gets larger.

Figure 13:
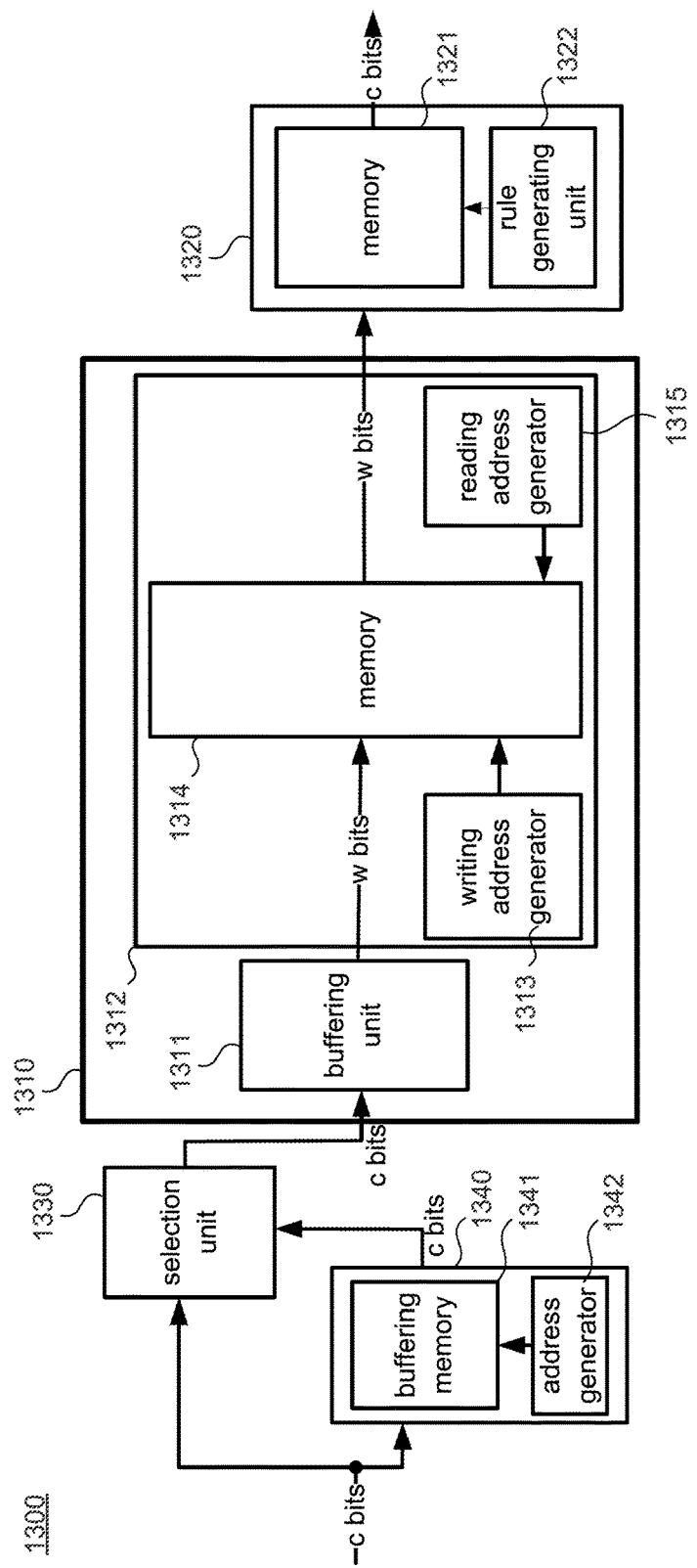
FIG. 13 is a function block diagram of a time and cell de-interleaving circuit according to another embodiment of the present invention.

FIG. 13 shows a function block diagram of a time and cell de-interleaving circuit according to another embodiment of the present invention. A time and cell de-interleaving circuit 1300 includes a storage circuit 1310, a de-interleaving operation circuit 1320, a selection unit 1330 and a buffering memory module 1340. The storage circuit 1310 includes a buffering unit 1311 and a memory module 1312. In this embodiment, the memory module 1312 has a bandwidth of w bits, and the size of one bit is c bits. After the buffering unit 1311 (e.g., a FIFO buffer) stores w/c cells, the w/c cells are together written into the memory 1314 of the memory module 1312. The memory module 1312 includes a writing address generator 1313 and a reading address generator 1315, which respectively generate target memory addresses for writing and reading operations of the memory 1314. The buffering memory module 1340 includes a buffering memory 1341 and an address generator 1342. The address generator 1342 generates writing addresses or reading addresses for accessing the buffering memory 1341. In practice, for example, the buffering memory module 1340 may be an SRAM. The de-interleaving operation circuit 1320 includes a memory 1321 and a rule generating unit 1322. The memory 1321 may be implemented by an SRAM. The rule generating unit 1322 generates a plurality of permutation rules, according to which the cells outputted from the storage circuit 1310 are written to and read from the memory 1321 to complete time and cell de-interleaving. The output of the de-interleaving operation circuit 1320 is a result that has undergone time de-interleaving and cell de-interleaving.

Figures 14A, 14B:
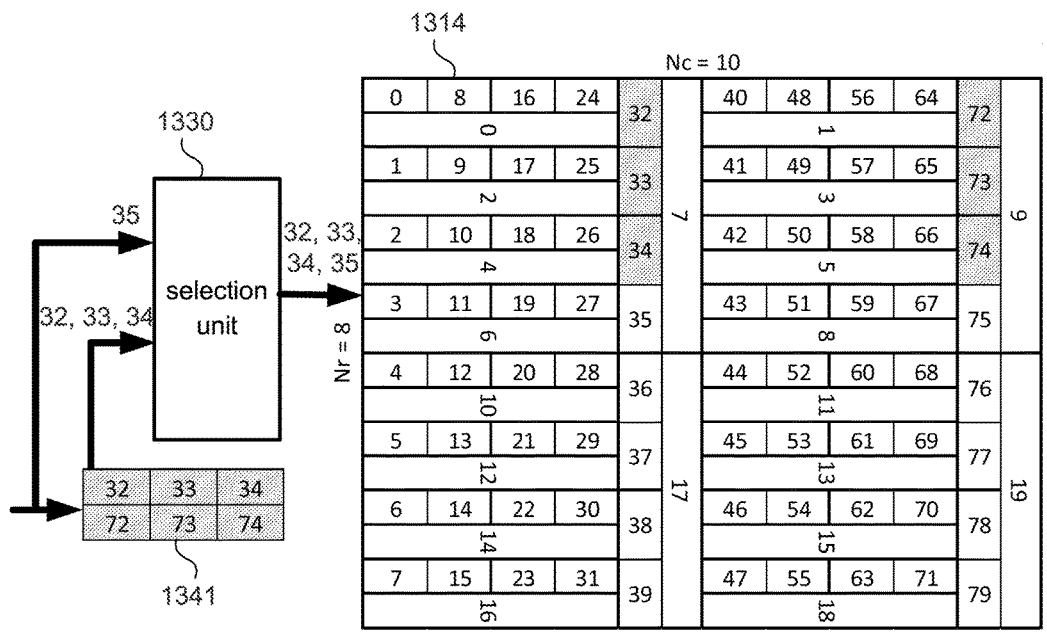

FIG. 14a, FIG. 14b, FIG. 14c and FIG. 14d show schematic diagrams of address numbers, cell numbers, read/writing sequences and permutation rules of the memory 1314, the memory 1321 and the memory 1341 when the present invention is applied for time and cell de-interleaving and a memory bandwidth is four times the size of cells. FIG. 14a depicts the address numbers of the memory 1314. There are a total of 20 addresses (16 in the horizontal direction, and 4 in the vertical direction), and each of the addresses may be written by one cell group (including 4 cells). The size of the memory 1314 may be represented by a general equation as: horizontal $$\frac{N_c}{5} \times N_r \times 4$$

cells, and vertical $$\frac{N_c}{5} \times \left\lceil \frac{N_r}{2} \right\rceil \times 4$$

cells. FIG. 14b depicts buffered contents in the buffering memory 1341 and the sequence of the selection unit 1330 writing data to the memory 1314. In the previous embodiment, when one cell group includes 4 cells (as shown in FIG. 9), the data belonging to the same FEC block and the data belonging to different FEC blocks form a cell group that is written to the memory 814 (e.g., in FIG. 9, the cell numbered 32 and the cells numbered 40, 48 and 56 form one cell group that is written to the memory 814). Thus, in a reading operation, one reading operation needs to be performed on each of the first and second FEC blocks for that cell group. To further reduce the number of times of accessing (reading/writing) the memory, in this embodiment, some cells are first stored using the buffering memory 1341 to arrange the sequence of writing these cells to the memory module, and the selection unit 1330 determines to output the newly arrived cells or the buffered cells to the storage circuit 1314. As such, the written data is appropriately reorganized, so that the cell groups are read from the memory 1314 more efficiently to reduce the number of times of accessing the memory 1314. The size of the buffering memory 1341 is $N_{FEC} \times (w/c-1)$ cells. In this example, $N_{FEC}=N_c/3=2$, and w/c=4. Thus, the buffering memory 1341 is capable of storing a total of 2×3=6 cells. The writing address generator 1313 generates addresses according to the rule below:

For horizontal memory addresses:

$$\left( i = 0; i < \frac{N_c}{5} \times N_r; i = i + 1 \right)$$

$$\begin{cases} C_i = i \bmod \frac{N_c}{5} \\ R_i = i \ div \ \frac{N_c}{5} \\ WR_i = C_i \times N_r + R_i \end{cases}$$

For vertical memory addresses:

$$\left( i = 0; i < \frac{N_c}{5} \times N_r; i = i + 1 \right)$$

$$\begin{cases} C_i = i \bmod \frac{N_c}{5} \\ R_i = i \ div \ \frac{N_c}{5} \\ WR_i = C_i \times \left\lceil \frac{N_r}{4} \right\rceil + R_i \end{cases}$$

Writing addresses and written contents are as follows. In the 0$^{th}$ writing operation, the cell group including cells numbered {0, 8, 16, 24} is written to the horizontal address 0, and the buffering memory 1341 buffers the cell numbered 32; in the 1$^{st}$ writing operation, the cell group including cells numbered {40, 48, 56, 64} is written to the horizontal memory address 8, and the buffering memory 1314 buffers the cell numbered 72; in the 2$^{nd}$ writing operation, the cell group including cells numbered {1, 9, 17, 25} is written to the horizontal address 1, and the buffering memory 1341 buffers the cell numbered 33; . . . ; in the 6$^{th}$ writing operation, the cell group including the cells numbered {3, 11, 19, 27} is written to the horizontal memory address 3; in the 7$^{th}$ writing operation, the cells numbered 32, 33 and 34 are first read from the buffering memory 1341, and the newly arrived cell numbered 35 and the read cells form one cell group, which is then written to the vertical memory address 2; in the 8$^{th}$ writing operation, the cell group including cells numbered {43, 51, 59, 67} is written to the horizontal memory address 11; in the 9$^{th}$ writing operation, the cells numbered 72, 73, and 74 are read from the buffering memory 1314, and the newly arrived cell numbered 75 and the read cells form one cell group, which is then written to the vertical memory address 2; in the 10$^{th}$ writing operation, the cell group including cells numbered {4, 12, 20, 28} is written to the horizontal memory address 4, and the buffering memory 1341 buffers the cell numbered 36; in the 11$^{th}$ writing operation, the cell group including the cells numbered {44, 52, 60, 68} is written to the horizontal memory address 12, and the buffering memory 1341 buffers the cell numbered 76; . . . ; in the 17$^{th}$ writing operation, the cells numbered 36, 37 and 38 are read from the memory 1341, the newly arrived cell numbered 39 and the read cells form one cell group, which is then written to the vertical memory address 1; in the 18$^{th}$ writing operation, the cell group including cells numbered {47, 55, 63, 71} is written to the horizontal memory address 15; and in the 19$^{th}$ writing operation, the cells numbered 76, 77 and 78 are read from the buffering memory 1341, the newly arrived cell numbered 79 and the read cells form one cell group, which is then written to the vertical memory address 3.

Figures 14C, 14D:
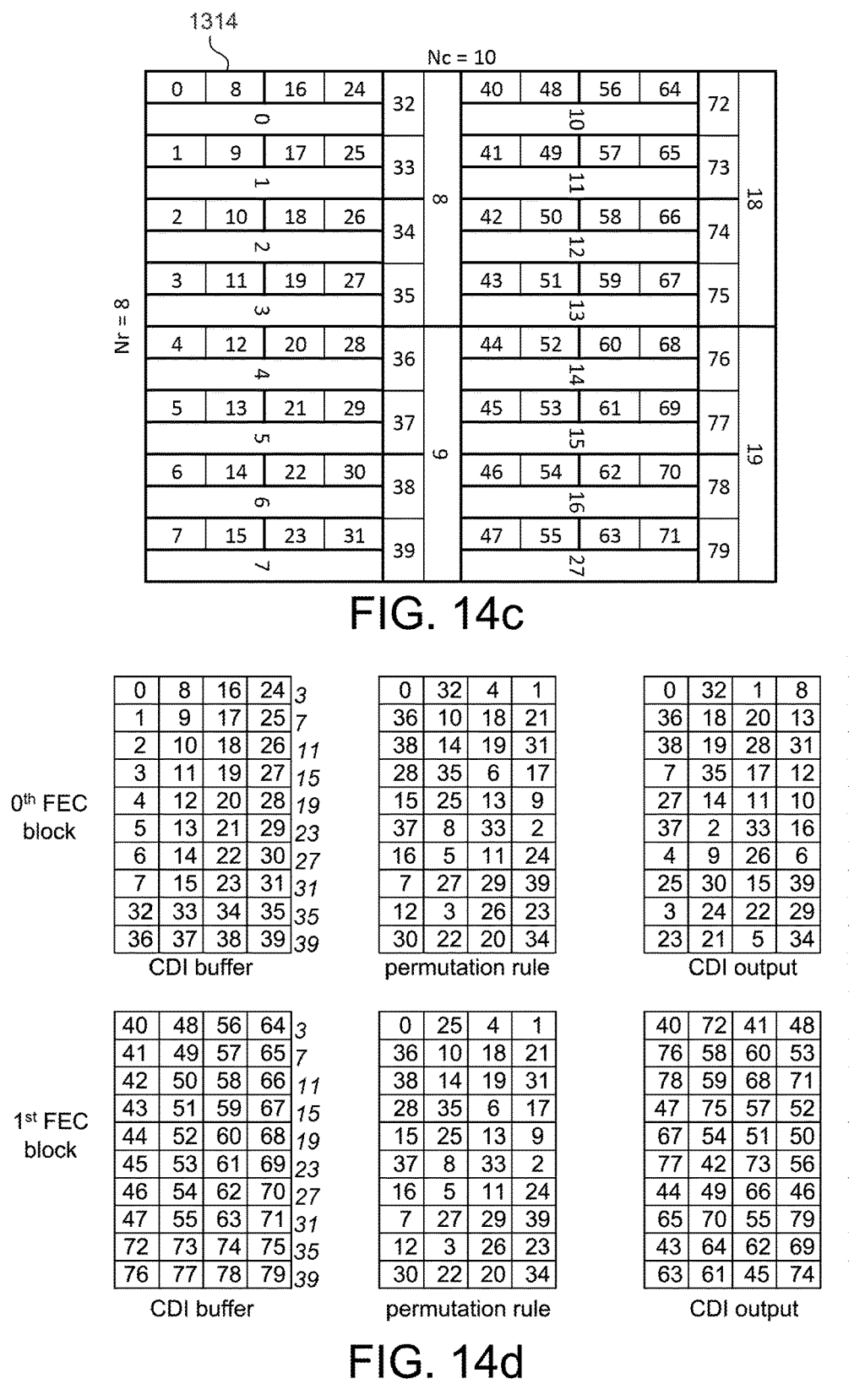

FIG. 14C shows a sequence for reading from the memory 1314. The reading address generator 1315 generates addresses according to the rules below:

For horizontal memory addresses:

$$\left( i = 0; i < \frac{N_c}{5} \times N_r; i = i + 1 \right)$$

$$\begin{cases} C_i = i \ div \ N_r \\ R_i = i \bmod N_r \\ RD_i = C_i \times N_r + R_i = i \end{cases}$$

For vertical memory addresses:

$$\left( i = 0; i < \frac{N_c}{5} \times \left\lceil \frac{N_r}{4} \right\rceil; i = i + 1 \right)$$

$$\begin{cases} C_i = i \ div \ \left\lceil \frac{N_r}{4} \right\rceil \\ R_i = i \bmod \left\lceil \frac{N_r}{4} \right\rceil \\ RD_i = C_i \times \left\lceil \frac{N_r}{4} \right\rceil + R_i = i \end{cases}$$

In the above equations, $RD_i$ is a read address. Read addresses and read contents are as follows. In the 0$^{th}$ reading operation, the cell group including cells numbered {0, 8, 16, 24} is read from the horizontal memory address 0, and written to the memory 1321; in the 1$^{st}$ reading operation, the cell group including cells numbered {1, 9, 17, 25} is read from the horizontal memory address 1, and written to the memory 1321; . . . ; in the 8$^{th}$ reading operation, the cell group including cells numbered {32, 33, 34, 35} is read from the vertical memory address 0, and written to the memory 1321; in the 9$^{th}$ reading operation, the cell group including cells numbered {36, 37, 38, 39} is read from the vertical memory address 1, and written to the memory 1321; in the 10$^{th}$ reading operation, the cell group including cells numbered {40, 48, 56, 64} is read from the horizontal memory address 8, and written to the memory 1321; . . . ; in the 18$^{th}$ reading operation, the cell group including cells numbered {72, 73, 74, 75} is read from the vertical memory address 2, and written to the memory 1321; and in the 19$^{th}$ reading operation, the cell group including cells numbered {76, 77, 78, 79} is read from the vertical memory address 3, and are written to the memory 1321.

FIG. 14d shows a schematic diagram of a storage state, permutation rules and an output sequence of cells in the memory 1321 of the de-interleaving operation circuit 1320 of the present invention. In one preferred embodiment, the cells are sequentially written to the memory 1321 according to an increasing order of the addresses of the memory 1321 as well as the sequence of reading the cells from the memory 1314. As shown in FIG. 14d, taking the 0$^{th}$ FEC block for example, it is written according to the sequence of the cells outputted from the memory 1314 to obtain the result shown on the left of the drawing. The memory 1321 is read according to the reading rule shown in the middle of the drawing to obtain the cell de-interleaved result shown on the right of the drawing. For the 1$^{st}$ FEC block, it has the same writing rule and the same reading rule as the writing rule of the 0$^{th}$ FEC block. The reason is that, in this embodiment, the relative position for reading data from the memory 1314 is the same for every FEC block, and so the same arrangement is also present in the memory 1321. Thus, only one reading rule needs to be followed. This reading rule may be represented as follows:

$$L_{r,new}(q) = \begin{cases} \text{if } L_r(q) < N_r \times 4, & (L_r(q) \bmod N_r) \times 4 + (L_r(q) \text{div } N_r) \\ \text{else}, & L_r(q) \end{cases}$$

The new reading rule ($L_r$, new(q)) may have different operation methods according to the range of $L_r(q)$. $L_r(q)$ is the reading rule of the sequence of the input cells having undergone time de-interleaving (corresponding to a simple drawing in FIG. 5), and is used for performing cell de-interleaving.

In another preferred embodiment, the rule generating unit 1322 changes the sequence for writing the cells to memory 1321, such that the sequence of writing the cells to the memory 1321 is equivalent to the sequence of having undergone time de-interleaving. Thus, the reading rule used for cell de-interleaving of the prior art can be used for reading the cells from the memory 1321, and need not be adjusted. This writing rule is as follows:

```
for (i = 0; i < N_r × 4; i = i + 1){
    CDI_WR_i = (i div 4) − (i mod 4) × N_r.
}
for (i = N_r × 4; i < N_r × 5; i = i + 1){
    CDI_WR_i − i
}
```

Figures 15A, 15B:
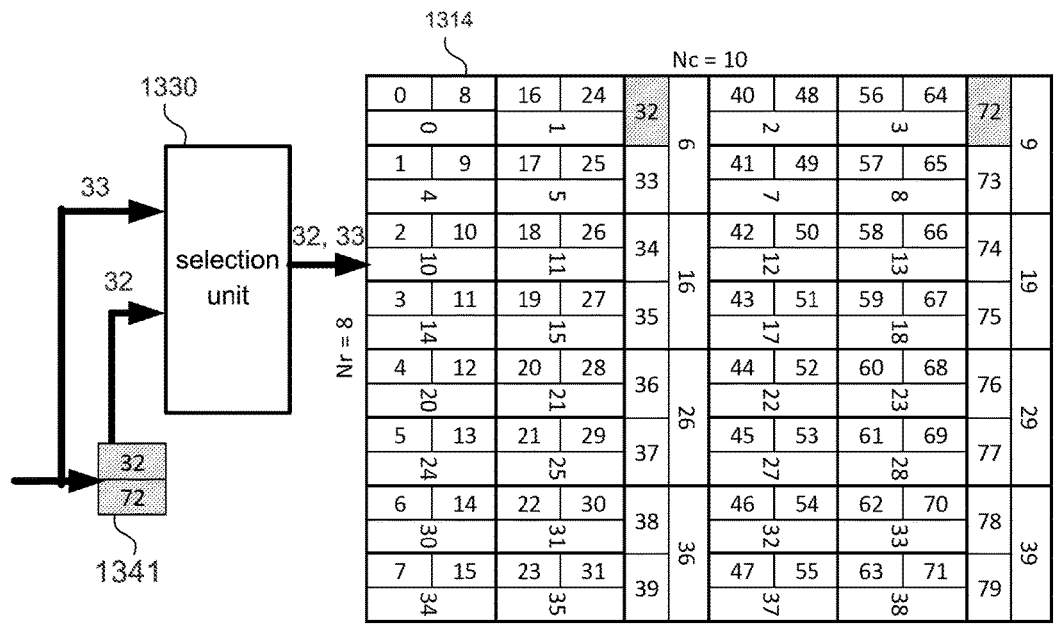
Figure 15C:
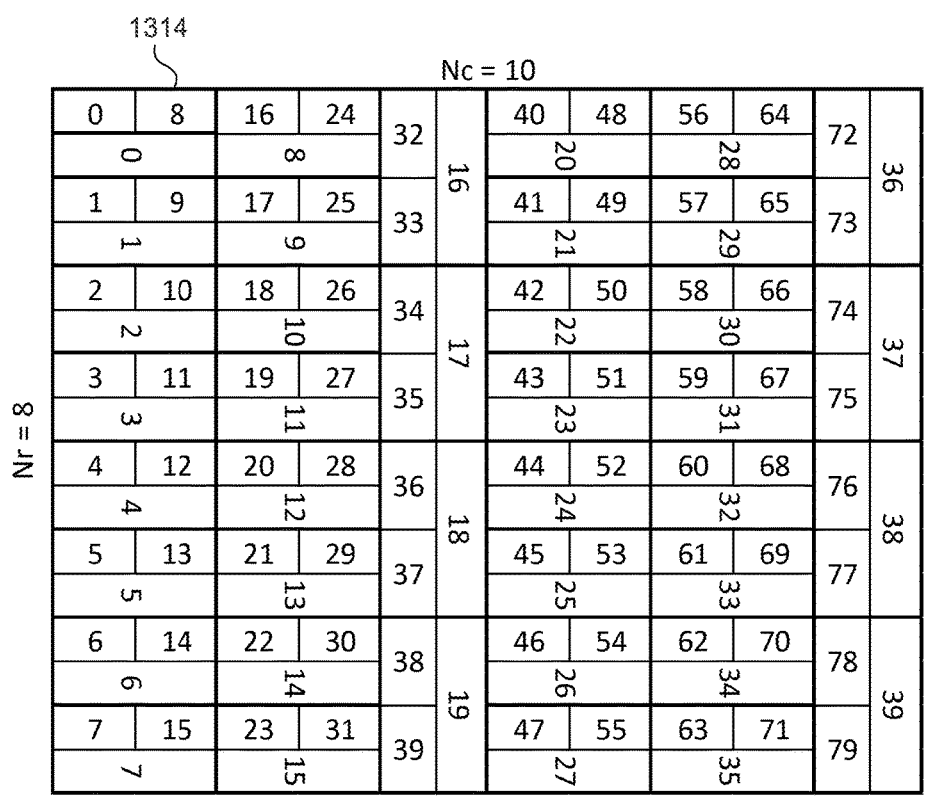

FIG. 15a, FIG. 15b and FIG. 15c show schematic diagrams of address numbers, cell numbers and read/writing sequences of the memory 1314 and the memory 1321 when the present invention is applied for time and cell de-interleaving and a memory bandwidth is twice the size of cells. Associated operation details may be deduced by one person skilled in the art based on the foregoing embodiments, and shall be omitted herein.

FIG. 16 shows the number of times of reading/writing the memory 1314 (when the memory bandwidth is twice and four times the size of cells) under different LDPC block lengths and different modulation modes, and the ratio to the number of times of reading/writing a conventional memory. The results show that, under the same LDPC block length and the same modulation mode, regardless of the ratio (w/c) of the bandwidth size to the size of cells, compared to the prior art, the present invention effectively reduces the number of times of accessing (reading/writing) the memory, and such effect is particularly significant as w/c gets larger.

Figure 17:
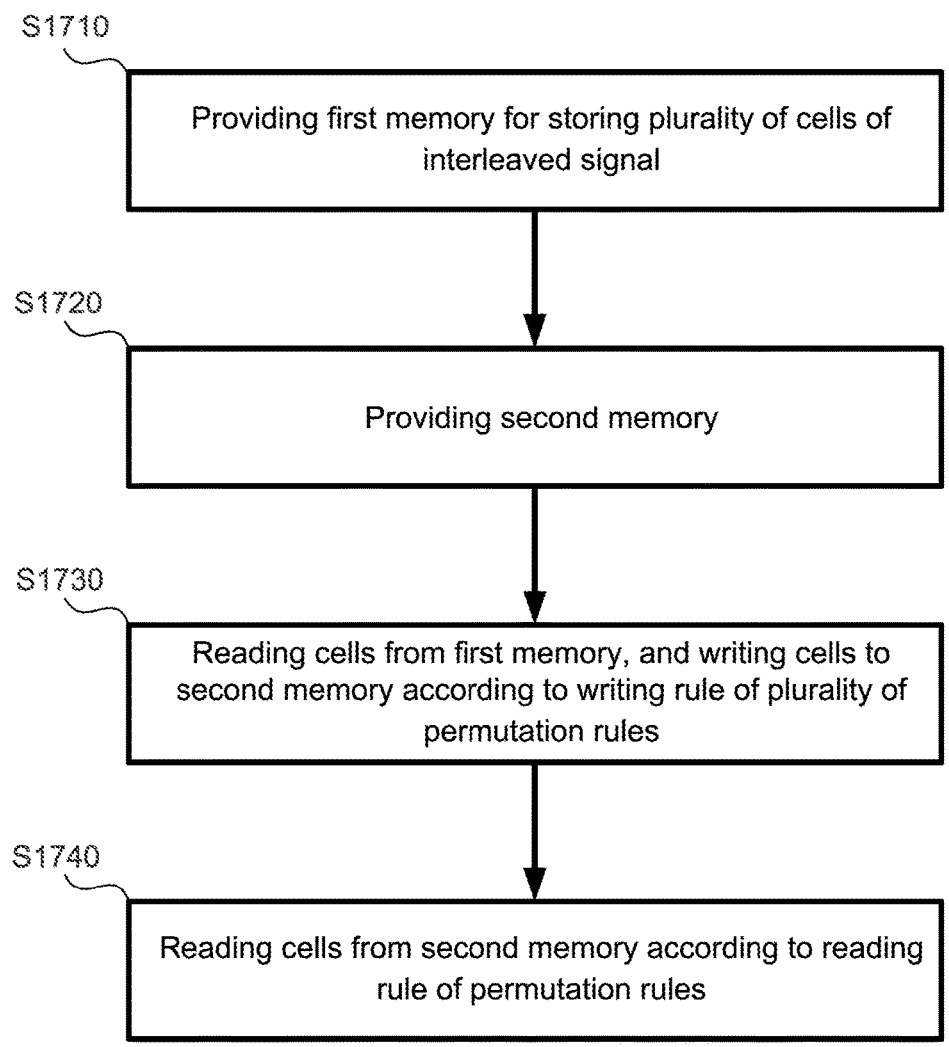
FIG. 17 is a flowchart of a method for performing time and cell de-interleaving according to an embodiment of the present invention.

FIG. 17 shows a flowchart of a method for performing time and cell de-interleaving according to an embodiment of the present invention. In addition to the foregoing time and cell de-interleaving circuit, the present invention correspondingly discloses a method for performing time and cell de-interleaving method applied to a signal receiver of a communication system. The method may be performed by the foregoing time and cell de-interleaving circuit 800 or an equivalent circuit. As shown in FIG. 17, the method for performing time and cell de-interleaving according to an embodiment of the present invention includes following steps.

In step S1710, a first memory is provided. The first memory stores a plurality of cells of an interleaved signal. The interleaved signal includes a plurality of FEC blocks, and each of the FEC blocks includes a plurality of cells. Reading/Writing operations of the first memory are performed in a unit of one cell group (i.e., a word of the first memory) that includes K cells, where K is a positive integer greater than 1.

In step S1720, a second memory is provided. The second memory stores the cells read from the first memory, and is capable of simultaneously storing all cells of one FEC block. The cells read from the first memory are not complete with time de-interleaving; that is to say, the sequence of the cells read from the first memory is not in a sequence of having undergone time de-interleaving.

In step S1730, the cells are read from the first memory, and are written to the second memory according to a writing rule of a plurality of permutation rules.

In step S1740, the cells are read from the second memory according to a reading rule of the permutation rules, such that the cells read from the second memory are complete with time de-interleaving and cell de-interleaving.

In one preferred embodiment, the cells of each FEC block are written to the second memory according to the same writing rule, but the cells are read from the second memory according to different reading rules based on different FEC blocks. The writing rule is sequentially writing to the second memory according to the sequence of reading from the first memory. There are K corresponding reading rules, which are used in turn by the FEC blocks according to the sequence of writing to the second memory.

In another preferred embodiment, the cells of each FEC block are read from the second memory according to the same reading rule, but the cells are written to the second memory according to different writing rules based on different FEC blocks. There are K corresponding writing rules, which are used in turn by the FEC blocks according to the sequence of writing to the second memory. The cells written to the second memory according to the writing rule display the distribution of having undergone time de-interleaving, and so the K writing rules correspond to the same reading rule. The reading rule is a rule of cell de-interleaving of the prior art, i.e., the cells read from the second memory according to the reading rule are complete with cell de-interleaving.

Figure 18:
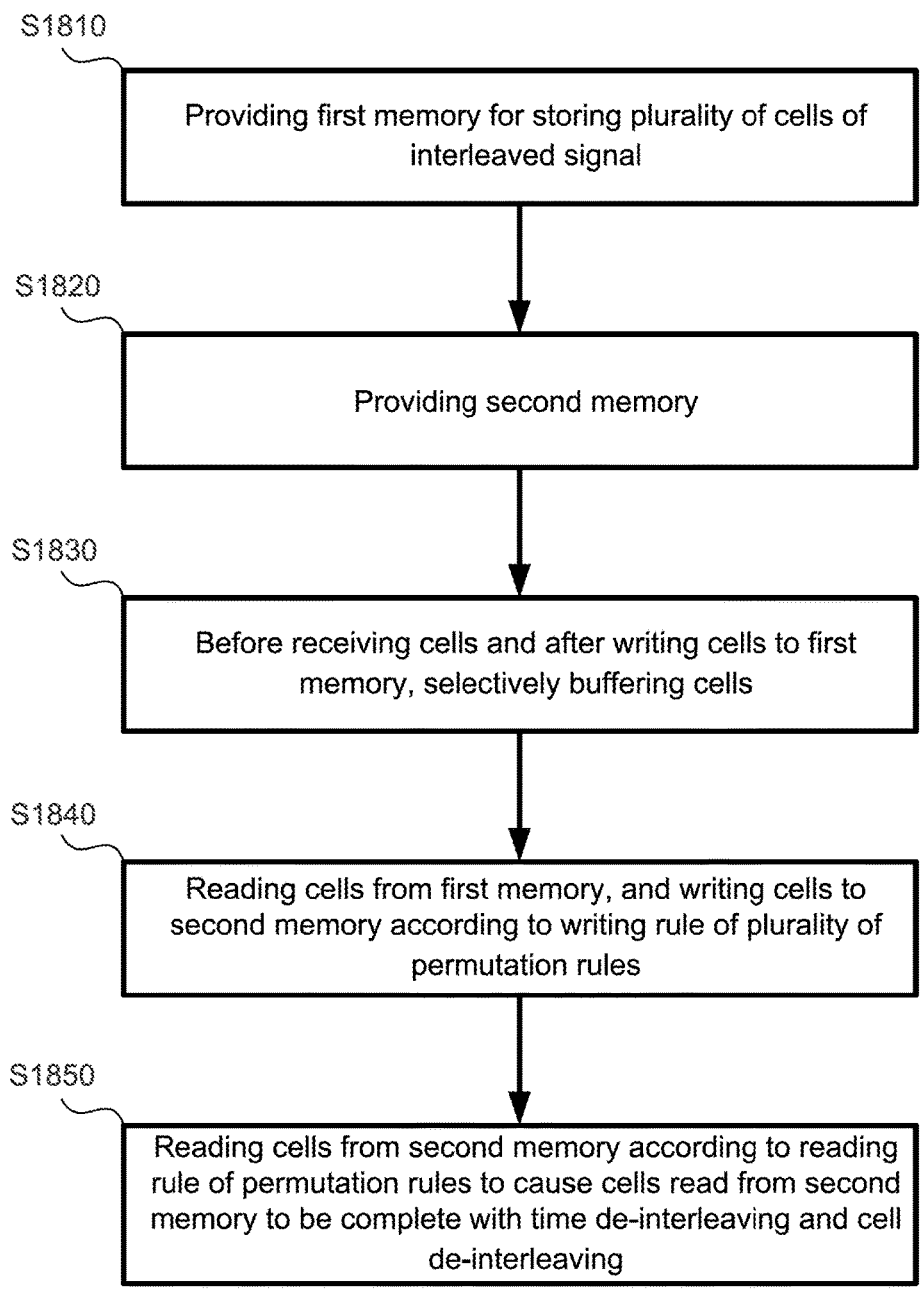
FIG. 18 is a flowchart of a method for performing time and cell de-interleaving according to another embodiment of the present invention.

FIG. 18 shows a flowchart of a method for performing time and cell de-interleaving according to another embodiment of the present invention. This method may be performed by the foregoing time and cell de-interleaving circuit 1300 or an equivalent device. As shown in FIG. 18, the method for performing time and cell de-interleaving according to an embodiment of the present invention includes following steps.

In step S1810, a first memory is provided. The first memory stores a plurality of cells of an interleaved signal. The interleaved signal includes a plurality of FEC blocks, and each of the FEC blocks includes a plurality of cells. Reading/Writing operations of the first memory are performed in a unit of one cell group (i.e., a word of the first memory) that includes K cells, where K is a positive integer greater than 1.

In step S1820, a second memory is provided. The second memory stores the cells read from the first memory, and is capable of simultaneously storing all cells of one FEC block. The cells read from the first memory are not complete with time de-interleaving; that is to say, the sequence of the cells read from the first memory is not in a sequence of having undergone time de-interleaving.

In step S1830, after receiving the cells and before writing the cells to the first memory, the cells are selectively buffered. Some of the cells are first buffered before being stored to the first memory, and jointly form one cell group with later cells and written to the first memory. As such, during the process of reading all of the cells of the same FEC block, data of other FEC blocks is not read, hence enhancing the reading efficiency.

In step S1840, the cells are read from the first memory, and written to the second memory according to a writing rule of a plurality of permutation rules.

In step S1850, the cells are read from the second memory according to a reading rule of the permutation rules, such that the cells read from the second memory are complete with time de-interleaving and cell de-interleaving.

In this method, for the same cell group, the first memory is read once and written once. The cells of each FEC block are written to the second memory according to the same writing rule, and read according to the same reading rule. In one preferred embodiment, the reading rule is writing to the second memory according to the sequence of reading the cells from the first memory, and the sequence of the cells read according to the reading rule are in a sequence of having undergone time de-interleaving and cell de-interleaving. In another preferred embodiment, the cells written to the second memory according to the writing rule display a distribution of having undergone time de-interleaving, and the reading rule is a rule of cell de-interleaving of the prior art; that is, the cells read from the second memory according to the reading rule are complete with cell de-interleaving.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A time and cell de-interleaving circuit, located at a signal receiver of a communications system operating according to a predetermined broadcasting standard transmission protocol requiring time de-interleaving and cell de-interleaving on an interleaved signal, the interleaved signal comprising a plurality of cells, the time and cell de-interleaving circuit reducing the required number of times a memory storing the interleaved signal is accessed, comprising:

a first memory device, storing the cells of said interleaved signal;

a storage control circuit, controlling an access operation of the first memory device, the access operation performed for one cell group at a time, each cell group comprising K cells, where K is a positive integer greater than 1;

a second memory device, storing the cells read from the first memory device; and a rule generating unit, generating a plurality of permutation rules including a set of writing rules and a set of reading rules according to time interleaving and cell interleaving characteristics of said predetermined broadcasting standard transmission protocol of the interleaved signal, the plurality of permutation rules specifying a respective memory address for reading or writing each of the cells during reading and writing operations, writing the cells read from the first memory device to the second memory device according to a writing rule of the permutation rules, and reading the cells from the second memory device according to a reading rule of the permutation rules, wherein the plurality of permutation rules are generated using the number of cells in each cell group K, a total number of cell groups of the first memory device, a total number of rows of the first memory device, and a total number of columns of the first memory device such that the cells of the interleaved signal read from the second memory device in accordance with the reading rule of the permutation rules are simultaneously cell de-interleaved and time de-interleaved.

2. The time and cell de-interleaving circuit according to claim 1, wherein the interleaved signal comprises a plurality of forward error correction (FEC) blocks, the plurality of permutation rules comprise one writing rule and K reading rules, the writing rule implemented for writing every of the FEC blocks, and the K reading rules implemented for reading different FEC blocks of the FEC blocks, respectively.

3. The time and cell de-interleaving circuit according to claim 2, wherein the writing rule causes the cells read from the first memory device to be written to the second memory device according to a sequence of reading the cells from the first memory device.

4. The time and cell de-interleaving circuit according to claim 1, wherein the interleaved signal comprises a plurality of FEC blocks, the plurality of permutation rules comprise one reading rule and K writing rules, the reading rule implemented for reading every of the FEC blocks, and the K writing rules implemented for writing different FEC blocks of the FEC blocks, respectively.

5. The time and cell de-interleaving circuit according to claim 4, wherein a result of the rule generating unit writing the cells to the second memory device according to the writing rule is equivalent to a result of the cells sequentially written to the second memory device according to a sequence of having undergone time de-interleaving, and the reading rule is a rule of cell de-interleaving.

6. The time and cell de-interleaving circuit according to claim 1, further comprising:
   a buffering memory, buffering a part of the cells before the cells are written to the first memory device to arrange a sequence for writing the cells to the first memory device; and
   a selection unit, selecting one of writing the cells of the interleaved signal to the first memory device and writing the cells buffered in the buffering memory to the first memory device.

7. The time and cell de-interleaving circuit according to claim 6, wherein during time de-interleaving and cell de-interleaving, for each cell group, the first memory device is written only once and read only once.

8. The time and cell de-interleaving circuit according to claim 6, wherein a time block of the interleaved signal comprises N FEC blocks, and the buffering memory is at least capable of simultaneously storing $N \times (K-1)$ cells, where N is a positive integer greater than 1.

9. A method, applied to a signal receiver of a communication system operating according to a predetermined transmission protocol, for performing time and cell de-interleaving on an interleaved signal, the interleaved signal comprising a plurality of cells, the method reducing the required number of times a memory storing the interleaved signal is accessed, comprising:
   providing a first memory device, the first memory device storing the cells of said interleaved signal, the cells read and written one cell group at a time, each cell group comprising K cells, where K is a positive integer greater than 1;
   providing a second memory device, the second memory device storing the cells read from the first memory device;
   generating a plurality of permutation rules including a set of writing rules and a set of reading rules according to time interleaving and cell interleaving characteristics of said predetermined broadcasting standard transmission protocol of the interleaved signal, the plurality of permutation rules specifying a respective memory address for reading or writing each of the cells during reading and writing operations;
   reading the cells from the first memory device, and writing the cells to the second memory device according to a writing rule of the plurality of permutation rules, K consecutive cells written to the second memory device being from a same cell group; and
   reading the cells from the second memory device according to a reading rule of the permutation rules, wherein the cells read from the second memory device in accordance with the reading rule of the permutation rules are simultaneously time de-interleaved and cell de-interleaved;
   wherein said permutation rules are generated using the number of cells in each cell group K, a total number of cell groups of the first memory device, a total number of rows of the first memory device, and a total number of columns of the first memory device according to time interleaving and cell interleaving settings of said predetermined broadcasting standard transmission protocol such that the cells of the interleaved signal read from the second memory device in accordance with the reading rule of the permutation rules are simultaneously cell de-interleaved and time de-interleaved.

10. The method according to claim 9, wherein the interleaved signal comprises a plurality of forward error correction (FEC) blocks, the plurality of permutation rules comprise one writing rule and K reading rules, the writing rule implemented for writing every of the FEC blocks, and the K reading rules implemented for reading different FEC blocks of the FEC blocks, respectively.

11. The method according to claim 9, wherein the writing rule causes the cells read from the first memory device to be written to the second memory device according to a sequence of reading the cells from the first memory device.

12. The method according to claim 9, wherein the interleaved signal comprises a plurality of FEC blocks, the permutation rules comprise one of the reading rule and K writing rules, the reading rule implemented for reading every of the FEC blocks, and the K writing rules implemented for writing different FEC blocks of the FEC blocks, respectively.

13. The method according to claim 9, further comprising:
   providing a buffering memory, the buffering memory buffering a part of the cells before the cells are written to the first memory device; and
   after receiving the cells and before writing the cells to the first memory device, selectively buffering the cells in the buffering memory.

14. The method according to claim 13, wherein during time de-interleaving and cell de-interleaving, for each cell group, the first memory device is written only once and read only once.

15. The method according to claim 13, wherein a time block of the interleaved signal comprises N FEC blocks, and the buffering memory is at least capable of simultaneously storing $N \times (K-1)$ cells, where N is a positive integer greater than 1.

16. A time and cell de-interleaving circuit, located in a signal receiver of a communication system operating according to a predetermined transmission protocol requiring time de-interleaving and cell de-interleaving on an interleaved signal, the interleaved signal comprising a plurality of cells, the time and cell de-interleaving circuit reducing the required number of times a memory storing the interleaved signal is accessed, comprising:
   a storage control circuit, controlling an access operation of a first memory device to write and read the cells of said interleaved signal into and from the first memory device, the access operation performed one cell group at a time, each cell group comprising K cells, where K is a positive integer greater than 1;
   a second memory device, storing the cells read from the first memory device; and
   a rule generating unit,
      generating a plurality of permutation rules including a set of writing rules and a set of reading rules according to time interleaving and cell interleaving characteristics of said predetermined broadcasting standard transmission protocol of the interleaved signal, the plurality of permutation rules specifying a respective memory address for reading or writing each of the cells during reading and writing operations,
      writing the cells read from the first memory device to the second memory device according to a writing rule of the permutation rules to cause K consecutive cells written to the second memory device to be from a same cell group, and reading the cells stored in the second memory device according to a reading rule of the permutation rules, wherein the plurality of permutation rules are generated to cause using the number of cells in each cell group K, a total number of cell groups of the first memory device, a total number of rows of the first memory device, and a total number of columns of the first memory device such that the cells of the interleaved signal read from the second memory device in accordance with the reading rule of the permutation rules to be simultaneously time de-interleaved and cell de-interleaved.

17. The time and cell de-interleaving circuit according to claim 16, wherein the interleaved signal comprises a plurality of FEC blocks, the plurality of permutation rules comprise one writing rule and K reading rules, the writing rule implemented for writing every of the FEC blocks, and the K reading rules implemented for reading different FEC blocks of the FEC blocks, respectively.

18. The time and cell de-interleaving circuit according to claim 17, wherein the writing rule causes the cells read from the first memory device to be written to the second memory device according to a sequence of reading the cells from the first memory device.

19. The time and cell de-interleaving circuit according to claim 16, wherein the interleaved signal comprises a plurality of FEC blocks, the plurality of permutation rules comprise one reading rule and K writing rules, the reading rule implemented for reading every of the FEC blocks, and the K writing rules implemented for writing different FEC blocks of the FEC blocks, respectively.

20. The time and cell de-interleaving circuit according to claim 19, wherein a result of the rule generating unit writing the cells to the second memory device according to the writing rule is equivalent to a result of the cells sequentially written to the second memory device according to a sequence of having undergone time de-interleaving, and the reading rule is a rule of cell de-interleaving.

* * * * *